United States Patent
Tanaka et al.

(10) Patent No.: US 6,377,596 B1
(45) Date of Patent: Apr. 23, 2002

(54) SEMICONDUCTOR MATERIALS, METHODS FOR FABRICATING SEMICONDUCTOR MATERIALS, AND SEMICONDUCTOR DEVICES

(75) Inventors: Toshiaki Tanaka, Kodaira; Shigeru Aoki, Fujimi, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/043,384

(22) PCT Filed: Sep. 17, 1996

(86) PCT No.: PCT/JP96/02663

§ 371 Date: Mar. 18, 1998

§ 102(e) Date: Mar. 18, 1998

(87) PCT Pub. No.: WO97/11518

PCT Pub. Date: Mar. 27, 1997

(30) Foreign Application Priority Data

Sep. 18, 1995 (JP) ............................................. 7-238142
Sep. 2, 1996 (JP) ............................................. 8-231658

(51) Int. Cl.$^7$ ......................... H01S 5/20; H01L 21/205; H01L 29/04
(52) U.S. Cl. .............................. 372/45; 257/52; 438/29
(58) Field of Search ................. 372/44–46; 257/49–52; 438/22, 29

(56) References Cited

U.S. PATENT DOCUMENTS

| | | | |
|---|---|---|---|
| 4,612,072 A | 9/1986 | Morrison et al. | ........... 148/175 |
| 4,876,210 A | 10/1989 | Barnett et al. | ................. 437/5 |

(List continued on next page.)

FOREIGN PATENT DOCUMENTS

| | | |
|---|---|---|
| JP | 57010223 | 1/1982 |
| JP | 60088471 | 5/1985 |
| JP | 61-7621 | 1/1986 |
| JP | 62104039 | 5/1987 |
| JP | A-3-132016 | 6/1991 |

(List continued on next page.)

OTHER PUBLICATIONS

S. Nakamura, et al. "Candela–class high–brightness InGaN/ALGaN . . . ", Applied Physics Letters, vol. 64, pp. 1687–1689, Mar. 28, 1994.

S. Nakamura et al. "High–power InGaN single–quantum–well–structure . . . " Applied Physics Letters, vol. 67, pp. 1868–1870, Sep. 25, 1995.

S. Nakamura et al., "High–Brightness InGaN Blue, Green and Yellow . . . ", Japanese Journal of Applied Physics, vol. 34 pp. L797–L799. 1, Jul. 1995.

S. Nakamura et al., "Superbright Green InGaN Single Quantum . . . ", Japanese Journal of Applied Physics, vol. 34, pp. L1332–L1335, Oct. 15, 1995.

I. Akasaki et al., "Stimulated Emission by Current Injection . . . ", Japanese Journal of Applied Physics, vol. 34, pp. L1517–L1519, Nov. 15, 1995.

(List continued on next page.)

Primary Examiner—James W. Davie
(74) Attorney, Agent, or Firm—Antonelli, Terry, Stout & Kraus, LLP

(57) ABSTRACT

An insulating member (4) of an amorphous structure partially opened to expose a substrate (1; 1, 2, 3) is formed on the substrate. At least a compound semiconductor (5, 51, 52) containing at least nitrogen as a constituent element is deposited on the insulating member (4) and the substrate (40) exposed by the opening thereby to form a semiconductor material (1, 5, 51, 52). A semiconductor material (6, 7) configured of the first semiconductor material or configured of the first semiconductor material and another semiconductor material grown on the first semiconductor material is processed thereby to form a semiconductor device.

23 Claims, 19 Drawing Sheets

U.S. PATENT DOCUMENTS

| | | | |
|---|---|---|---|
| 5,247,533 A | 9/1993 | Okazaki et al. | 372/45 |
| 5,290,393 A | 3/1994 | Nakamura | 156/613 |
| 5,334,277 A | 8/1994 | Nakamura | 117/102 |
| 5,389,571 A | 2/1995 | Takeuchi et al. | 437/133 |
| 5,644,145 A * | 7/1997 | Ishihara | 257/52 |
| 5,985,704 A * | 11/1999 | Adachi et al. | 438/166 |

FOREIGN PATENT DOCUMENTS

| | | |
|---|---|---|
| JP | 4-127521 | 4/1992 |
| JP | A-4-188678 | 7/1992 |
| JP | A-4-321280 | 11/1992 |
| JP | A-5-7016 | 1/1993 |
| JP | A-5-41536 | 2/1993 |
| JP | A-5-41541 | 2/1993 |
| JP | 6-151962 | 5/1994 |
| JP | A-6-101587 | 12/1994 |
| JP | A-8-18159 | 1/1996 |
| JP | A-8-116093 | 5/1996 |
| JP | A-8-125251 | 5/1996 |
| JP | A-8-153931 | 6/1996 |
| JP | A-8-222812 | 8/1996 |

OTHER PUBLICATIONS

S. Nakamura et al., "InGaN multi–quantum–well structure laser . . . ", Applied Physics Letters, vol. 68, (1996), pp. 2105–2107.

Nikkei Electronics, No. 650 (Dec. 4, 1995), p. 7.

Kato et al., "Reduction of dislocations in InGaAs layer on GaAs using epitaxial lateral overgrowth", *Journal of Crystal Growth*, 115 (1991) pp. 174–179. (No Month).

Patent Abstracts of Japan, Publ. No. 06151962, Publ. Date: May 31, 1994.

Patent Abstracts of Japan, Publ. No. 04127521, Publ. Date: Apr. 28, 1992.

Kiyoko Kato, et al., "Reduction of Dislocations in INGAAS Layer on GAAS using Epitaxial Lateral Overgrowth", Journal of Crystal Growth, vol. 115, No. 1/04, Dec. 2, 1991, pp. 174–179.

Y. Kato et al., "Selective Growth of Wurtzite GaN . . . ", Journal of Crystal Growth, vol. 144, No. 3/04, Dec. 2, 1994, pp. 133–1240.

"Heterjunction AIN GaN Ultraviolet Laser with Tunnel Injection", IBM Technical Bulletin, vol. 19, No. 10, Mar. 1977, p. 4049.

* cited by examiner

DISLOCATION (CRYSTAL DEFECT)

FIG. 3D PLAN VIEW TAKIN IN FIG.3C 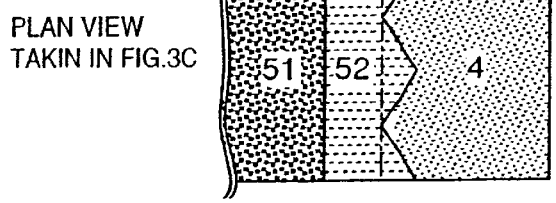
FIG. 3E (VIEW OF COMPLETED ASSEMBLY) 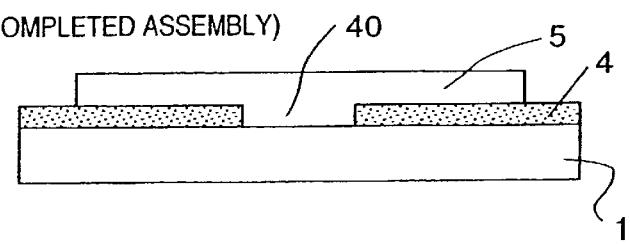

◉ : N ATOM
○ : Ga ATOM

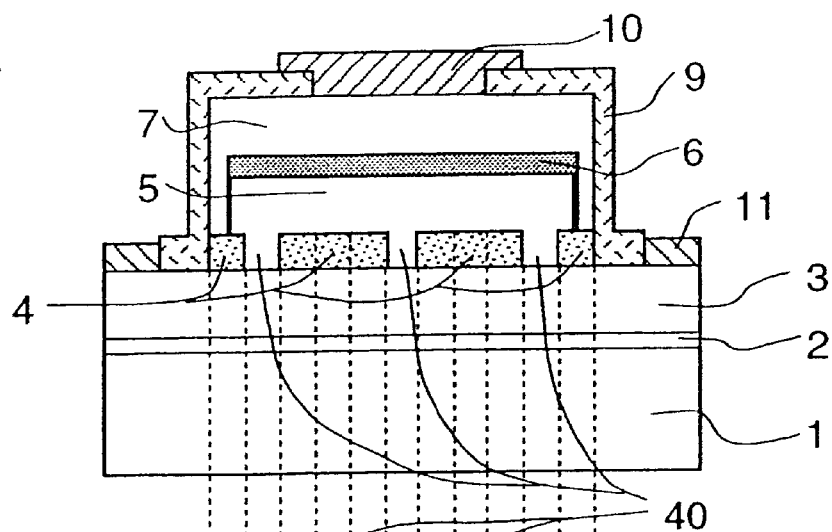
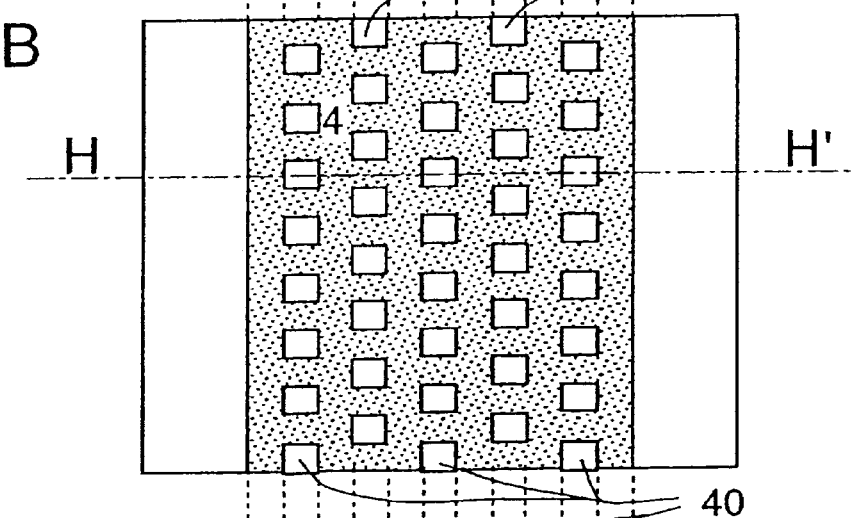
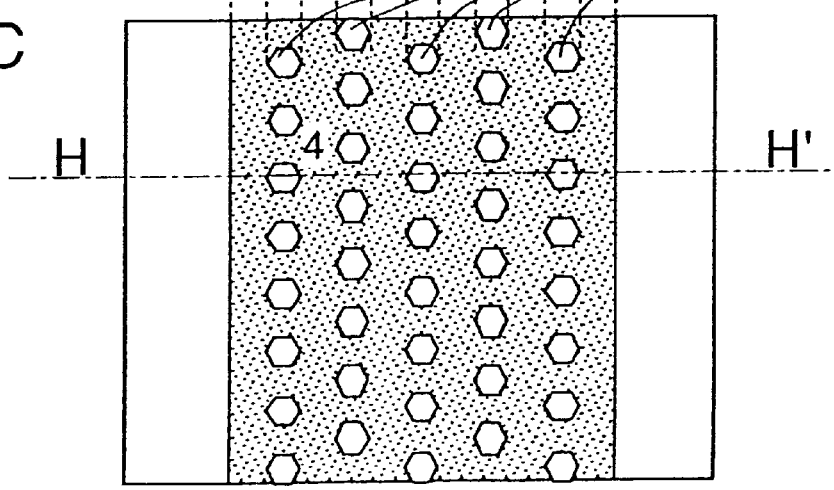

SEMICONDUCTOR MATERIALS, METHODS FOR FABRICATING SEMICONDUCTOR MATERIALS, AND SEMICONDUCTOR DEVICES

TECHNICAL FIELD

The present invention relates to the crystal growth of a III–V compound semiconductor composed of at least one of what is called the group-III elements including B, Al, Ga, In and Tl and at least one of what is called the group-V elements including N, P, As, Sb and Bi, or more in particular to crystal growth techniques desirable for forming the crystal of a structure having the hexagonal symmetry structure or the crystal of a III–V compound (hereinafter referred to as "the nitride semiconductor") required to contain N (nitrogen) as a group-V element.

Also, the present invention relates to a semiconductor device composed of the crystal having a structure of the hexagonal system or a nitride semiconductor, and to semiconductor light-emitting diodes and semiconductor laser devices suitable for emitting the light with wavelengths up to the ultra-violet ray or suitable as a light source for optical information processings or a light source for optical measurement equipments.

BACKGROUND ART

In recent years, various reports on the diodes and laser devices for emitting a light in the wavelength of blue region using GaInN/GaN/AlGa materials have been published in Appl. Phys. Lett., Vol. 64, March 1944, pp. 1687–1689 (Article 1); Appl. Phys. Lett., Vol. 67, September 1995, pp. 1868–1870 (Article 2); Jpn. J. Appl. Phys., Vol. 34–7A, July 1995, pp. L797–L799 (Article 3); Jpn. J. Appl. Phys., Vol. 34-10B, October 1995, pp. L1332–L1335 (Article 4); and Jpn. J. Appl. Phys., Vol. 34–11B, November 1995, pp. L1517–L1519 (Article 5).

What is shared by the semiconductor devices disclosed in Articles 1 to 5 is that a buffer layer composed of the above-mentioned nitride semiconductor is formed on a sapphire ($Al_2O_3$) substrate, and a nitride semiconductor layer is grown on the buffer layer. Such a structure is disclosed in JP-A-4-297023 (and JP-A-7-312350 constituting a divisional application thereof, and a corresponding U.S. application Ser. No. 5,290,393) and JP-A-4-321280. According to the teaching of JP-A-4-297023, a polycrystalline layer is produced by forming a first nitride semiconductor layer made of $Ga_xAl_{1-x}N$ ($0 \leq x \leq 1$) on a sapphire layer at 300 to 700° C. lower than the melting points of these materials. When a second nitride semiconductor layer is grown on this polycrystalline layer at a temperature of 1000 to 1050° C., the second nitride semiconductor layer is epitaxially grown with the grains (crystal grains) constituting the first nitride semiconductor layer as nuclei. As a result, an epitaxial film of a nitride semiconductor having fine surface morphology can be formed on the sapphire substrate. A proposal thus has been made to utilize the above-mentioned polycrystalline layer as a buffer layer for forming a semiconductor device.

The reason why a semiconductor device composed of the above-mentioned nitride semiconductor is formed on a sapphire substrate is, as disclosed in JP-A-6-101587, that the crystal structure of sapphire, unlike that of GaAs or the like (having a cubic symmetry structure of zinc-blende type), has a hexagonal closed-packing structure (also called hexagonal zinc sulfide or wurtzite structure). According to this publication, however, the difference in lattice constant between GaN and sapphire is as large as about 14%. The nitride semiconductor layer formed on the sapphire substrate, therefore, develops lattice defects such as dislocations, so that the non-saturated bonding caused in the nitride semiconductor layer forms a doner level or absorbs elements of impurities constituting donors. The resulting problem is that this nitride semiconductor layer assumes N type and the life time of the carriers injected into this nitride semiconductor layer is shortened. This publication, in order to solve this problem, discloses a technique which employs a substrate made of $MgAl_2O_4$ having a cubic symmetry spinel crystal structure or MgO having a NaCl-type crystal structure and fabricates nitride semiconductor layers on the substrate by matching the lattice constants between them. A semiconductor laser using this technique is reported in Appl. Phys. Lett., Vol. 68, April 1996, pp. 2105–2107 (Article 6).

The above-mentioned conventional techniques teach the possibility of realizing a semiconductor device made of what is called a nitride semiconductor required to contain N (nitrogen) as a III–V chemical compound semiconductor or a group-V element having a crystal structure of the hexagonal symmetry structure. Nevertheless, sufficient data (for example, the continuously operating time of a laser device) are not available to guarantee the practicability of such a semiconductor device. Especially, the supplementary trials conducted by the inventors show that the density of defects developed in the nitride semiconductor layer is as high as $10^{11}$ $cm^{-2}$, and the inventors judged that a laser device capable of being operated continuously for at least 1000 hours cannot be realized under the above-mentioned conditions.

In recent years, NIKKEI ELECTRONICS, Dec. 4, 1995 issue, No. 650, pp. 7 (Article 7) has reported that as a result of a joint research made between Cree Research, Inc. and North America Phillips, it was found that the use of SiC crystal as a substrate reduces the lattice defect density of the nitride semiconductor layer formed on the substrate to as low as $10^8$ $cm^{-2}$ and thus can realize blue laser diodes higher in brightness than the conventional devices. According to Article 7, however, the defect density of the nitride semiconductor layer is insufficient to lengthen the life time of the laser diode, and the reduction in the defect density ($10^4$ $cm^{-2}$ at present) of the crystal of the SiC substrate is indispensable for reducing the defect density of the nitride semiconductor layer. In constructing a semiconductor laser by forming a nitride semiconductor layer on a SiC substrate, therefore, an improved quality of the SiC substrate as well as the growth of a nitride semiconductor layer is indispensable for lengthening the life time, and the development cost is expected to increase.

Also, the articles and publications introduced above refer to the configuration of a nitride material used for an optical active layer or an optical waveguide layer but not to the shape of the active layer or the waveguide for controlling the transverse mode of the semiconductor laser. Thus, none of the articles and publications contain the description of a method of reducing the crystal defect density suitable for the waveguide structure mentioned above or, especially, a method of reducing the optical loss in the neighborhood of the active layer of the waveguide.

DISCLOSURE OF INVENTION

A first object of the present invention is to realize a crystal growth technique for forming a semiconductor layer having a very low defect density made of a III–V compound semiconductor having a crystal structure of the hexagonal symmetry structure or made of what is called a nitride semiconductor required to contain N (nitrogen) as a group-V element. "A very low defect density" indicates a defect density on the order of $10^7 \cdot cm^{-2}$ or less which is difficult to attain by the above-mentioned technique using a SiC substrate. This crystal growth technique not only includes a technique for reducing the defect density of a fabricated semiconductor layer uniformly as a whole but also is aimed at examining what is called the selective crystal growth for reducing the defect density only in the desired region.

A second object of the present invention is to lengthen the life time of the semiconductor device fabricated using the above-mentioned crystal growth technique or to improve the life or mobility of the carriers involved in the operation of the semiconductor device to a sufficient value for practical application of the semiconductor device. Especially with the light-emitting diode or the laser diode, the second object of the invention is to define a configuration of an optical waveguide suitable for geometrically controlling or reducing the optical loss of the waveguide and the active layer based on the above-mentioned selective crystal growth method, and a configuration suitable for obtaining a stimulated emission light with high internal quantum efficiency from a flat or smooth active layer of the laser device. Specifically, the technique according to one aspect of the second object of the invention is aimed at defining the structure of a waveguide and an active layer capable of guiding the fundamental transverse mode stably in the wavelength of blue-violet region and suitable for realizing a laser diode operating with low threshold current and high efficiency.

1. Introduction

One of the present inventors proposed a semiconductor laser device as described below in the specification of JP-A-7-238142 forming the foundation for the declaration of priority of the present application. An example will be described with reference to FIG. 1. A first nitride semiconductor layer (including a GaN buffer layer 2 and a n-type GaN optical waveguide layer 3) is formed by crystal growth on a single-crystal substrate 1 of sapphire ($\alpha$-$Al_2O_3$) having a (0001)C surface, and then an insulator mask 4 is formed on the first nitride semiconductor layer. This insulator mask 4 has regular patterns of rectangular window regions, in which the upper surface (the upper surface of the n-type GaN optical waveguide layer 3) is exposed. Under this condition, a second nitride semiconductor layer (a n-type GaN optical waveguide layer 5) is selectively grown on the insulator 4 (on the first nitride semiconductor layer in the window regions). FIG. 1B is a plan view of the insulator mask 4, and FIG. 1A is a sectional view taken in line A–A' in FIG. 1B.

Specifically, the semiconductor laser device proposed by one of the present inventors has a feature in that a nucleation region for crystal growth of the second nitride semiconductor layer is confined to the surface of the n-type GaN optical waveguide layer 3 exposed in the above-mentioned window regions, and by thus improving the three-dimensional growth density, the second nitride semiconductor layer is grown in such a manner as to fill the window regions first and when the uppermost surface of the grown portions reaches a level flush with the upper surface of the insulator 4, the growth of the second nitride semiconductor layer is started on the insulator 4. The surface of each portion of the second nitride semiconductor layer protruded from each window region grows to extend in the directions parallel and perpendicular to the upper surface of the insulator 4. In the case where the window areas of substantially the same size are arranged regularly (or substantially equidistantly), therefore, the crystal layers that have extended from each pair of adjacent window regions coalesce with each other on the insulator 4 substantially at the same time. This produces the effect of reducing the crystal defects or crystal grain boundaries of the second nitride semiconductor layer, as compared with the normal bulk growth in which the second nitride semiconductor layer is formed on the insulator 4 as a crystal layer having a flat surface of growth without using any insulator mask.

The present inventors fabricated several lots of the above-described semiconductor laser devices according to the present invention on an insulator of $SiO_2$, and by reducing the thickness of these lots along the direction of crystal growth, observed them under the transmission electron microscope (TEM). The semiconductor laser devices each was fabricated by forming a first nitride semiconductor layer, an insulator having openings (window regions) and a second nitride semiconductor layer, in that order, on the (0001)C surface of a sapphire ($\alpha$-$Al_2O_3$) single-crystal substrate. Also, a portion of the second nitride semiconductor layer is formed in the openings, and coupled to the first nitride semiconductor layer on the bottom of the openings. The following knowledge has been obtained from what is called the cross-sectional TEM image of this semiconductor laser device.

Knowledge 1: The crystal defect density of the second nitride semiconductor layer grown on the $SiO_2$ film (insulator) is in or lower than the range of $10^4$ to $10^5$ cm$^{-2}$. In contrast, the crystal defect density of the second nitride semiconductor layer grown from the upper surface of the first nitride semiconductor layer in the openings of $SiO_2$ is at the same level of $10^9$ to $10^{11}$ cm$^{-2}$ as reported in the past. Most of the defects (dislocations) observed in the second nitride semiconductor layer grown in the openings are originated in the interface of the sapphire substrate and intrude into the openings through the first nitride semiconductor layer, while only a small portion of the defects intrudes into the second nitride semiconductor layer formed on the $SiO_2$ layer. In other words, the defects observed in the second nitride semiconductor layer on $SiO_2$ sharply decrease away from the $SiO_2$ openings. Origination of the defects is shown schematically by dashed lines in FIG. 1.

Applying Knowledge 1 to the unit structure of the hexagonal crystal system shown in FIG. 2, the present inventors confined the nucleation for crystal growth of a nitride semiconductor crystal by forming openings in an insulator, and with regard to a nitride semiconductor laser device formed with an increased nucleation density, the inventors have examined as follows:

The growth of the crystal having a hexagonal zinc sulfide (wurtzite) structure which is a kind of a hexagonal crystal system has such a feature that defects extend selectively along c-axis but do not multiply along other axes. A transmission electron diffraction pattern has confirmed that the second nitride semiconductor layers grown in the openings and on the insulator are both the crystal of wurtzite structure. The nitride semiconductor layer on the insulator, however, is substantially free of the defects extending along c-axis constituting the feature of the wurtzite structure. Suppose that the second nitride semiconductor layer is divided into two regions about imaginary interfaces (indicated by one-dot chains in FIGS. 1A and 1B) extending along the side walls of the openings. Almost all the defects in the regions on the insulator are successors to the defects formed in the openings and are received at the imaginary interfaces. Consequently, on the assumption that the region on the insulator grows in the direction substantially perpendicular to c-axis from the imaginary interfaces (i.e., in what is called homoepitaxial growth), the low defect density in the particular region is considered due to the property of crystal growth of the wurtzite structure in which no defect multiplies along other than c-axis direction.

In view of this, the present inventors have concluded as follows:

Conclusion 1: The crystal of a nitride semiconductor grows extending in vertical direction from the surface of the region having a crystal structure in the openings of the insulator (i.e., in the direction perpendicular to the particular surface) following the atomic arrangement of the same surface, and the nitride semiconductor grown and protruded out of the openings extends onto the insulator in transversal direction (i.e., in the direction substantially parallel to the upper surface of the insulator) from the sides of the nitride semiconductor protruded from the openings as new growth interfaces. In other words, the crystal growth of a nitride semiconductor is what is called the selective crystal growth exhibiting a behavior in the openings different from that on the surface of the insulator. In the latter case, i.e., on the surface of the insulator, the crystal growth is substantially homoepitaxial.

The c-axis is an axis of the coordinates (called the crystal axis) for defining the atomic arrangement of the unit cells of the crystal of the hexagonal symmetry structure. In FIG. 2, the c-axis is designated by arrow (unit vector) c ($a_1$ axis, $a_2$ axis and $a_3$ axis are also similarly designated). In FIG. 2, group-III atoms (Ga, Al, etc.) are designated by white circles, and group-V atoms (N, As, etc.) by black circles. The crystal surface of the hexagonal symmetry structure is expressed by index ($a_1$, $a_2$, $a_3$, c) defined by these unit vectors, an example of which is shown in FIG. 2. Sapphire has also a crystal structure of the hexagonal system like a nitride semiconductor, and therefore the (0001)C surface thereof is a crystal surface orthogonal to c-axis as obvious from FIG. 2. The $a_1$-axis and $a_2$-axis in the crystal structure of the hexagonal symmetry structure are alternatively expressed as the a-axis and the b-axis, respectively. On the basis of this notation, the a-axis, b-axis and the c-axis are sometimes expressed by the index [a, b, c] which normally represents [100], [010] and [001]. The fundamentals of the crystal structure of the hexagonal system were described above. With reference to FIG. 2, it will be understood that the above-mentioned first nitride semiconductor layer epitaxially grows along c-axis on the (0001) plane of the sapphire crystal substrate which is also the hexagonal symmetry structure. (The crystal of the first nitride semiconductor layer grown in this way is called to be "oriented along c-axis" with respect to the sapphire substrate).

For in-depth examination of the truth of the selective growth of the nitride semiconductor based on Conclusion 1, the present inventors have examined the crystalline property of the crystal structure (amorphous or single crystal) and the component elements of the insulator having the openings and the crystalline property of the nitride semiconductor formed in a manner to cover the insulator. In conducting this examination, as shown in FIGS. 3A to 3E, an insulator 4 having an opening 40 is formed or bonded on the (0001)C surface of a sapphire substrate 1, and like in the semiconductor laser device described above, a nitride semiconductor crystal 5 was grown on the insulator while confining the nucleation region to the opening. As the result of varying compositions of the insulator and the nitride semiconductor by lots, the following knowledge were obtained:

Knowledge 2: In the case where the insulator is made of an amorphous material such as $SiO_2$, $Si_3N_4$ ($SiN_x$), $SiO_2$:$P_2O_5$ (PSG), SiON or $Ta_2O_5$, the defects in the nitride semiconductor layer formed on the insulator sharply decrease with the distance away from the opening. Also, the crystal defect density in the nitride semiconductor layer formed on the insulator is in or lower than the range of $10^4$ to $10^5$ $cm^{-2}$.

Knowledge 3: In the case where the insulator is made of SiC or $BaTiO_3$ having a crystal structure, on the other hand, the growth of a nitride semiconductor started in the opening (on the sapphire substrate) at the same time as on the insulator. The grown surfaces of the nitride semiconductors had unevenesses reflecting the presence or absence of a window region, and crystal defects developed on the insulator in a density (in the range of $10^8$ to $10^{11}$ $cm^{-2}$) comparable to that in the opening.

Knowledge 4: Further, in the case where the surface of the sapphire was non-crystallized partially by irradiating Ga ions and a nitride semiconductor layer was grown on the non-crystallized surface, crystal has begun to grow on the non-crystallized surface almost at the same time as on the surface maintaining a crystal structure. It was found that the crystal defect density of the nitride semiconductor layer formed on the non-crystallized surface is lower than that on the surface having a crystal structure, but inferior (in the range of $10^6$ to $10^8$ $cm^{-2}$) to the crystal defect density obtained in the nitride semiconductor layer formed on the $SiO_2$ layer.

In each of the foregoing experiments, the density defect in the nitride semiconductor layer grown in the opening was in the range of $10^8$ to $10^{11}$ $cm^{-2}$. These experiments will be described in more detail later with reference to embodiments of the invention.

The present inventors reached the following conclusions from Knowledge 2 to 4:

Conclusion 2: In the case where the insulator forming the base of a nitride semiconductor is amorphous, the growth of the crystal of the nitride semiconductor becomes more active in the direction perpendicular to what is called the c-axis along which defects are not liable to extend easily. In the case where the insulator has a crystal structure, on the other hand, the crystal of the nitride semiconductor grows heteroepitaxially as defined by the atomic arrangement in the surface of the insulator. In other words, for the defects of a nitride semiconductor crystal to be reduced, it is indispensable to remove the effects that the atomic arrangement of an insulator may have on the atomic arrangement in the surface of the particular insulator, and therefore the insulator is required to have an amorphous structure.

Further, in order to verify Conclusion 2, the present inventors attached a minuscule droplet of Ga atoms to the center of the amorphous surface of an insulator formed uniformly and substantially flatly, and heated the resulting assembly to the growth temperature of 1030° C. in the ammonia environment. This experiment will be described in more detail later in the section of "Introduction" to embodiments of the invention. For the time being, only the result of the experiment will be described. This experiment, in order to clarify the mechanism of crystal growth on an insulator, oxidized the surface of a silicon single-crystal substrate and formed an amorphous $SiO_2$ film 101. A nitride semiconductor was grown on this $SiO_2$ film 101 without forming any openings therein. The following knowledge was obtained from this experiment:

Knowledge 5: A microcrystal having a mirror surface was formed in the region formed with the droplet of Ga atoms. Further, in the case where the temperature of the amorphous $SiO_3$ film was held at the growth temperature of 1030° C. and a trimethyl gallium (TMG) gas was supplied in the ammonia environment, a single crystal in the shape of hexagonal column was gradually grown about the above-mentioned microcrystal. An observation of the section of this single crystal under TEM shows that the density of the defects found in the crystal is considerably lower than the value ($10^4$ to $10^5$ cm$^{-2}$) for the above-mentioned selective growth. In fact, some lots were regarded substantially free of defects.

On the basis of the above-mentioned experiment and Knowledge 5 obtained therefrom, the present inventors interpreted the crystal growth mechanism for the nitride semiconductor on an insulating material according to the model shown in FIGS. 4A to 4E. In the model of FIGS. 4A to 4E, Ga atoms (group-III elements) are designated by white circles, and N atoms (group-V elements) are designated by black circles. Also, the direction of movement of each atom was indicated by an arrow attached to each circle. Opinions of the present inventors will be described in detail below.

According to the interpretation of the present inventors, the N atoms and the Ga atoms on the amorphous insulator move about actively in search of a stable state. This is similar to the behavior of Si atoms forming terraces and atomic steps in the topmost surface of silicon, known as the atomic migration. In the experiment under consideration, Ga atoms were fixed as a droplet (FIG. 4A) on an amorphous insulator. Exposure to an ammonia environment under this condition causes the N atoms supplied from the environment to attach on the insulator and reach the droplet of Ga atoms. As described above, N atoms of the group-V element, which share the electrons in the outermost cell with Ga atoms of the group-III element, form a pair in a stoichiometric ratio of Ga:N=1:1. In this way, a stability is attained by forming a compound (FIG. 4B).

Further, the insulator is set at an optimum temperature for growing a single crystal of GaN. Then, the N atoms concentrated in the Ga droplet build up a mutually regular arrangement in order to improve the stability of the compound, thereby forming the above-mentioned microcrystal (FIG. 4C). Under this condition, extraneous N atoms not participating in the formation of a GaN crystal exist on the insulator. Supplying TMG in this state, the ratio between the number of Ga atoms and the number of N atoms existing on the insulator approaches the above-mentioned stoichiometric ratio. In view of the fact that both Ga atoms and N atoms move about rapidly on the insulator, however, the probability of the two types of atoms bumping each other is negligibly low as compared with the probability of their bumping the GaN crystal fixed on the insulator. Thus, all of the N atoms and Ga atoms supplied from the TMG and the ammonia environment substantially participate in the growth of the GaN crystal (FIG. 4D). As a result, the crystal growth proceeds over the entire crystal surface of the Ga microcrystal, so that the GaN single crystal multiplies while maintaining the shape of a hexagonal column (FIG. 4E). As obvious from the above-mentioned process, the direct growth of a nitride semiconductor crystal on an insulator starts with the Ga atoms supplied as a droplet on the insulator as a nucleus.

From the foregoing interpretation, the present inventors have obtained the following conclusion:

Conclusion 3: A nitride semiconductor layer can be grown directly on an insulator of an amorphous structure without depending on the selective crystal growth described above. In this case, it is necessary to form a nucleus for crystal growth on the insulator. This nucleus is sufficiently composed of atoms of a group-III element alone.

Conclusion 3 indicates that no new crystal growth occurs unless a nucleus for crystal growth is supplied on the insulating layer on the one hand and that an unexpected crystal growth occurs depending on the type of atoms existing in the surface of an insulator having an amorphous structure on the other. Specifically, according to Conclusion 3, it is possible to explain consistently, as described below, that a nitride semiconductor layer begins to grow on the non-crystallized surface of a sapphire substrate obtained as Knowledge 4 almost at the same time as on the surface maintaining a crystal structure, and that the crystal defect density of such a nitride semiconductor layer is higher than that of the nitride semiconductor layer grown on a $SiO_3$ film.

First, the substantially simultaneous crystal growth in the non-crystallized portion and the crystal portion is caused by the fact that the Al atoms constituting a component element of the sapphire existing in the non-crystallized surface form a nucleus of a nitride semiconductor layer as a group-III element. In other words, the Al atoms play the same role as the droplet of Ga atoms described in Knowledge 5. Consequently, micro-crystals are formed in an irregular arrangement on the non-crystallized surface of the sapphire constituting an insulator of an amorphous structure, and the individual single-crystal regions grown therefrom coalesce with each other discretely during the crystal growth time, thereby giving rise to an unexpected mutual stress between the single-crystal regions. Especially, slight ups-and-downs of the surface of the insulator presents itself as a difference in the orientation angle of c-axis between the single crystal regions. Thus, the crystal in one region grows in such a direction as to bite into the crystal in another region, with the result that a stress which induces crystal defects is generated between the regions involved. The nitride semiconductor layer on the non-crystallized portion thus develops a great number of crystal defects, though not as much as experienced by the nitride semiconductor layer on the crystal portion (i.e, the portion affected by lattice mismatching).

The above-mentioned experiment revealed the fact that in growing a nitride semiconductor layer directly on an amorphous insulator, it is critical to control the distribution of the group-III elements on the surface of the insulator, and it became apparent that the insulator is desirably formed of a material not containing any group-III element as a constituent element. In other words, the composition of the material constituting the amorphous insulator is preferably different from that of the semiconductor layer formed on the amorphous insulator. Further, it is desirable not to contain any group-III element as a constituent element. Although the foregoing examination concerns a nitride semiconductor, i.e., what is called a III–V compound semiconductor which is composed of at least one of the group-III elements including B, Al, Ga, In and Tl on the one hand and at least one of the group-V elements including N, P, As, Sb and Bi on the other hand and which contains N (nitrogen) as a group-V element, the inventors have concluded that the same result of examination can be fed back for use with a semiconductor crystal constituting what is called a III–V compound having a structure of the hexagonal symmetry structure.

Based on the above-mentioned result of examination, the present inventors propose below a semiconductor material having a new configuration and a method of fabrication thereof. The semiconductor material referred to herein is not limited to those employed in the structure of a semiconductor device but includes, for example, a body on which a semiconductor device is formed.

Semiconductor material 1: This material comprises a first region made of a crystal of a compound semiconductor containing at least nitrogen as a constituent element and a second region made of an insulator, wherein at least a portion of the first region is grown on the second region.

Semiconductor material 2: This material comprises a first region made of a compound semiconductor having a crystal structure of the hexagonal symmetry structure and a second region made of an insulator having an amorphous structure, wherein at least a portion of the first region is grown on the second region.

The above-mentioned semiconductor materials include those characterized in that the density of defects existing in the crystal of the portion of the first region grown on the second region is not more than $10^7$ cm$^{-2}$. The above-mentioned semiconductor materials also include those characterized in that the compound semiconductor making up the first region is composed of a group-III element and a group-V element.

Semiconductor material fabrication method 1: This method is characterized by comprising a step of growing the crystal of a compound semiconductor containing at least nitrogen as a constituent element on the surface of an insulator having an amorphous structure.

Semiconductor material fabrication method 2: This method is characterized by comprising a step of growing the crystal structure of a hexagonal symmetry structure of a compound semiconductor configured of a group-III element and a group-V element on the surface of an insulator having an amorphous structure.

The above-mentioned methods of fabricating a semiconductor material, in which an insulator is formed on a crystal substrate of the hexagonal system and has at least an opening.

The above-mentioned semiconductor materials and methods for fabrication thereof are promising as a technique for providing a nitride semiconductor now closely watched as a material of a light-emitting diode for emitting the light of wavelengths from green to ultra-violet ray, i.e. a material with low defect density having a crystal structure of the hexagonal system composed of at least one of the group-III elements (especially, Ga, Al and In) and the N (nitrogen) element.

2. Application to Semiconductor Devices

The inventors propose a configuration of a semiconductor device realized by the above-mentioned fabrication technique of a semiconductor material. Specifically, the present invention provides a semiconductor device fabricated by forming a conventional nitride semiconductor by heteroepitaxial growth, in which the structural problem of the conventional semiconductor device unavoidably caused by the heteroepitaxial growth is avoided by combining the above-mentioned technique of transverse homoepitaxial growth.

The present invention will be briefly explained with reference to an application to a semiconductor optical device (a general term for a semiconductor laser device, an optical modulator and an optical switch) as an example of a semiconductor device. The significant basic feature of the semiconductor optical device according to this invention is that a semiconductor layer constituting an optical crystal region (a general term indicating regions for emitting, absorbing, containing or guiding the light, including an active layer and an optical waveguide) is formed on an amorphous insulator. Specifically, a semiconductor layer making up an optical crystal region or a semiconductor layer forming the base thereof is formed by the transverse homoepitaxial growth technique described above thereby to reduce the density of the defects generated in the crystal layer. From the viewpoint of the process for fabricating the device, unlike in the prior art for forming an optical crystal region by repeating the heteroepitaxial growth on the main surface of a substrate, the invention is characterized in that an insulator having at least an opening is formed on the main surface of a substrate and a semiconductor layer is formed by homoepitaxial growth on the insulator, after which an optical crystal region is formed as a semiconductor layer in or on the homoepitaxial layer by heteroepitaxial growth.

As described above, in the transverse crystal growth of a nitride semiconductor occurring on an region composed of an insulator having an amorphous structure (such as a body of an insulator), the semiconductor crystals grown transversely from different regions are transversely coalesced on the insulator region or on the body. This insulator region is formed as a mask-like insulator having at least an opening, and thus the growth of the crystal of a nitride semiconductor layer on the insulator is controlled, thereby considerably reducing the crystal defects such as dislocations in the nitride semiconductor layer formed on the insulator. With the semiconductor optical device according to the present invention characterized in that an optical crystal region is formed in a nitride semiconductor layer formed on the insulator or in a semiconductor layer formed by epitaxial growth on the nitride semiconductor layer, the crystal defect density in the optical region can be suppressed within or lower than the range of $10^4$ to $10^5$ cm$^{-2}$. With the conventional semiconductor optical device with an optical crystal region formed by sequential heteroepitaxial growth of the crystal of a nitride semiconductor on a crystal substrate (such as a sapphire substrate) having a different lattice constant, on the other hand, the crystal defect density occurring in the optical crystal region is $10^8$ to $10^{11}$ cm$^{-2}$.

The reduction of the crystal defects in the optical crystal region according to the present invention obviates all the problems of the scattering loss of light and the shortened life of the carriers contributing to light emission due to crystal defects at a time. Especially, the reduced crystal defects of an optical waveguide suppresses the loss of optical gain due to the scattering in the resonative amplification of stimulated emission light and therefore secures an operation with low threshold current and high efficiency.

Also, if a semiconductor layer between an optical crystal region and an electrode (hereinafter referred to as the contact layer) is formed by homoepitaxial growth on an insulator, an increased amount of n-type or p-type impurities can be doped into the contact layer. As a result, carriers can be easily generated by doping impurities into the contact layer, thereby making it possible to set the concentration of n- and p-type carriers to a high value on the order of $10^{18}$ to $10^{19}$ cm$^{-3}$. Consequently, in an application to a semiconductor laser device, for example, carriers of high density can be injected toward the optical active layer from the optical waveguide layer due to the reduced resistance of the contact layer. Thus, the optical gain can be improved and hence an operation can be performed with low threshold current and high efficiency.

The use of the waveguide structure described below is effective for improving the effect of a semiconductor optical device according to the invention. Well-known waveguide structures include a gain-guided structure with a limited region of an optical active layer for securing a gain by a current-blocking layer, and a refractive index-guided structure having a refractive index difference transversely of an optical active layer by such a stripe structure as a ridge stripe structure or a buried heterostructure (BH). Among these structures, the refractive index-guided structure, which can guide the wave stably in fundamental transverse mode, is especially important for assuring an operation with low threshold current and high efficiency. According to this invention, a substantial optical crystal region defined by the waveguide (i.e., the portion at which carriers are injected or where an electric field is applied) is set on an insulator so that carriers are injected and the electric field is applied intensively into an optical active layer and an optical waveguide layer composed of a semiconductor crystal of low defect density, thereby improving the emission efficiency with respect to the amount of injected carriers and the optical modulation efficiency according to the electric field intensity. The waveguide structure described above can be formed on, under or in the optical crystal region (in an optical guide layer or in a cladding layer). As a result, a refractive index-guided structure for propagating the laser beam stably in fundamental transverse mode can be realized while at the same time forming a waveguide structure of a crystal layer low in defect density and high in quality. A semiconductor laser operating with low threshold current and high efficiency can thus be produced. Also, a semiconductor laser device extended in a stripe in the direction of laser cavity is recommended, the shape of which is not of course limited. Further, a striped current-blocking layer and a layer for forming a refractive index difference, which can be formed by etching a semiconductor layer, can alternatively be formed newly as an insulator having at least an opening. In such a case, the refractive index-guided structure can be easily realized by selectively growing a semiconductor layer using an insulator having a stripe pattern as a mask.

Furthermore, in order to improve the crystallinity of the semiconductor layer constituting an optical crystal region, it is recommended that dummies be formed by selective crystal growth in such positions as to sandwich the optical crystal region. For the purpose of configuring a waveguide layer composed of a crystal layer of higher quality, for example, an insulator is used which has a dummy pattern on each side of a pattern (opening) for producing a waveguide structure by selective growth. By doing so, the unusual growth is avoided in forming a waveguide at the central portion and thus the crystallinity and the geometric controllability of the particular waveguide are remarkably improved. Also, the threshold current and the operating efficiency of the device are further improved by a configuration in which current is prevented from being injected from the electrode formed on the waveguide into the crystal layers grown in the dummy pattern.

The single-crystal substrate used for fabricating a semiconductor optical device according to the present invention is not limited to the above-mentioned sapphire substrate. The points to be noted in using a new single-crystal substrate in place of the sapphire substrate are described below. In the case of using a single-crystal substrate of hexagonal wurtzite structure, for example, the orientation of the substrate surface is set to (0001)C plane. When fabricating a stripe structure on this substrate, the insulator mask pattern is set in the direction perpendicular or parallel to the (11–20)A plane of the substrate. In this way, individual waveguide crystal layers having a rectangular section can be coalesced, thereby making it possible to fabricate a single large waveguide structure easily by use of the selective growth technique. In the case of using a single-crystal substrate of a cubic zinc-blende structure, on the other hand, the orientation of the substrate surface is set to the (111) plane. When fabricating a stripe structure on this substrate, an insulator mask pattern is set in the direction perpendicular to the (110) plane or perpendicular to the (1–10) plane of the substrate. A waveguide structure having a crystal in the shape similar to the above-mentioned case can thus be fabricated.

Various types of semiconductor optical devices according to the invention can be realized by employing various shapes of the openings formed in the insulator constituting the base for homoepitaxial growth. First, by quantizing the width of the openings of the insulator one-dimensionally or two-dimensionally transversely of an active layer, an optical active layer is produced with a quantum box structure or quantum wire advantageous for the operation of the laser device with low threshold current. Also, if a plurality of parallel striped openings are formed and the phase-matching conditions are appropriately regulated for the light generated from each semiconductor layer (active layer) selectively grown between the stripes, then a semiconductor device of a phased array structure can be configured thereby to achieve a high-output operation in fundamental transverse mode.

A semiconductor device according to the invention was described above taking a semiconductor optical device as an example. Nevertheless, the optical crystal region can be replaced with a region in which switchable carriers flow, thereby constituting a field effect transistor, for example. In the case of a field effect transistor, a semiconductor layer making up what is called a channel for activating the carriers is desirably formed on an insulator. An even higher effect is produced if the source region, the gate region, the drain region, etc. for this channel are formed on the insulator. The feature of an example of a preferable device configuration is that a source electrode, a gate electrode and a drain electrode are formed in juxtaposition on a uniform (openingless) amorphous and insulative region through a semiconductor region constituting a channel. This semiconductor device configuration is employed especially effectively for a high electron mobility transistor (HEMT) easily affected by the crystal defect density of the channel region.

Based on the above-mentioned result of examination, the present inventors propose below a semiconductor device having a new configuration. The term "semiconductor region" herein, unless otherwise specified, refers to the one formed of a nitride semiconductor material or a compound semiconductor material having a hexagonal crystal structure. Both semiconductor materials were defined in detail in "Introduction". Also, the "insulative region" is defined as a body or a layer (film) made of a material having an amorphous structure and exhibiting an electrical insulation property, and unless otherwise specified, is assumed not to be formed with any opening (i.e. a region where another region having a crystal structure is exposed). Any material meeting these conditions can be used to form an insulative region.

Semiconductor device 1: This semiconductor device is formed with a semiconductor region making up an optical system on an insulative region. The optical system represents the above-mentioned optical crystal region. With a laser device, a cavity structure for lasing is desirably arranged on the insulative region. This semiconductor device configuration can be employed for all of what are called semiconductor optical devices including a light-emitting diode (LED), a light transmission path and an optical modulator as well as for a semiconductor laser device.

Semiconductor device 2: This semiconductor device is formed with a semiconductor region composed of semiconductor layers having different band gaps (energy gaps) on an insulative region. These semiconductor layers constituting the semiconductor region include a first semiconductor layer and second semiconductor layers formed on and under the first semiconductor layer and having a larger band gap than the first semiconductor layer. The first semiconductor layer is used for injecting, confining or generating carriers. The second semiconductor layers, on the other hand, assist the first semiconductor layer in injecting or confining carriers. This semiconductor region can be what is called a quantum well structure with the thickness of the first semiconductor layer not more than the de Broglie wavelength or a multiple quantum well structure with the first and second semiconductor layers alternately formed in multiple stages. This device configuration is applicable also to a field effect transistor, a switching device and a logically operating device as well as to a semiconductor optical device. Also, the second semiconductor layers on and under the first semiconductor layer can have different compositions or different band gaps. This configuration is effective for realizing a field effect transistor, in which case the second semiconductor layer far from the gate electrode can be done without.

When any one of the above-mentioned semiconductor devices is fabricated in an existing semiconductor equipment, the above-mentioned insulative region can be formed on a region having a crystal structure, i.e., on a crystal substrate or a crystal layer (film).

BRIEF DESCRIPTION OF DRAWINGS

FIGS. 3A to 3E are diagrams chronologically showing the crystal growth by the crystal growth technique 1 according to the invention.

FIG. 13A is a longitudinal sectional view of an example of a semiconductor optical device according to an eighth embodiment of the invention.

FIG. 13B is a top plan view of an insulator mask formed in the device shown in FIG. 13A.

FIG. 13C is a longitudinal sectional view of another example of a device.

BEST MODE FOR CARRYING OUT THE INVENTION

1. Introduction

Figure 1A:
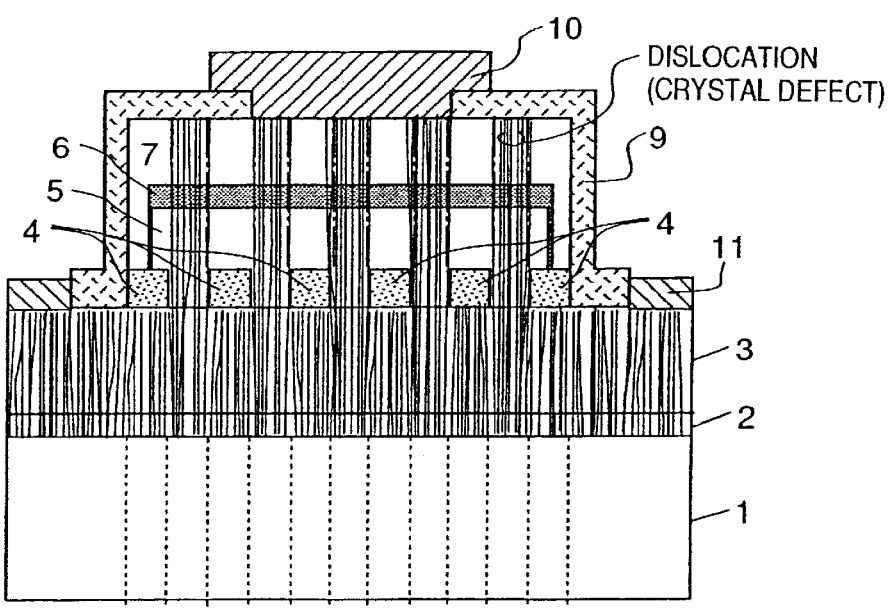
FIG. 1A is a diagram showing a longitudinal section (section taken in line A–A' in FIG. 1B) of an device structure of a semiconductor laser device according to the present invention.
Figure 1B:
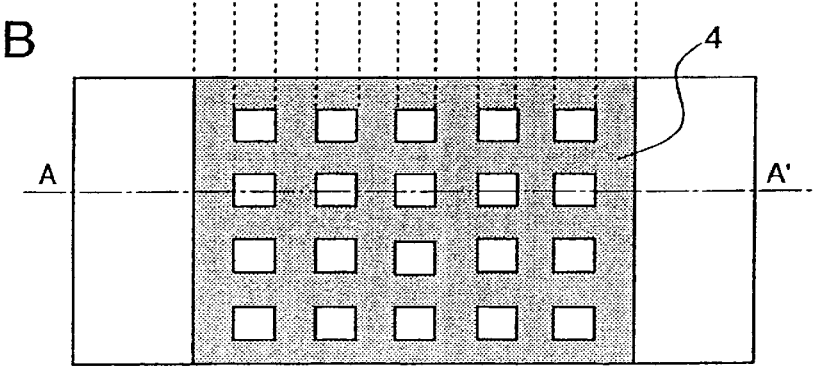
FIG. 1B is a diagram showing the upper surface of an insulator of the semiconductor laser device of in FIG. 1A.
Figure 2:
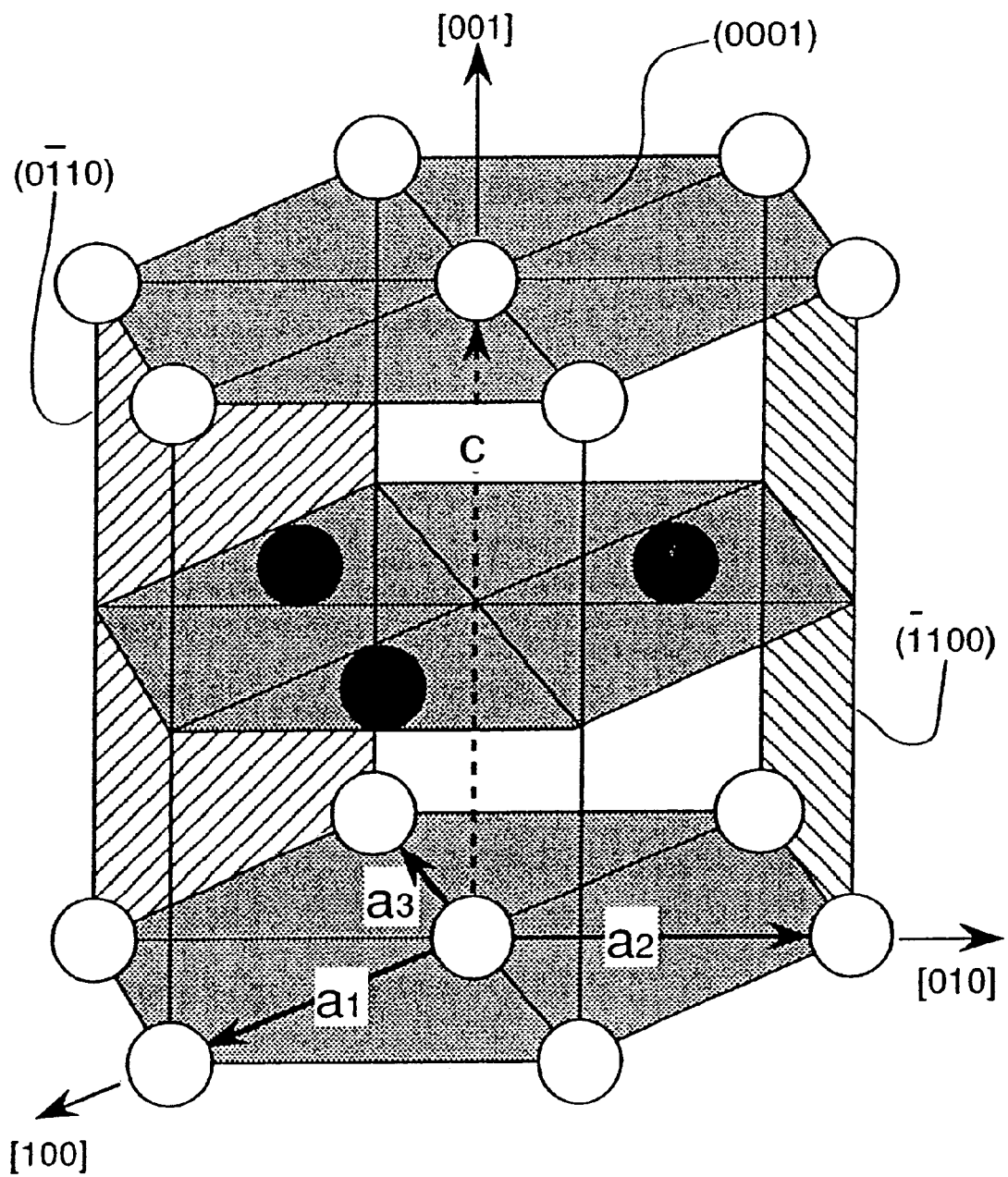
FIG. 2 is a diagram showing a unit crystal structure of a hexagonal symmetry structure.

First, explanation will be made about a semiconductor crystal growth technique constituting a basic concept of the present invention. The examination on the result of experiments on this technique was described in "Means for solving the problems". The knowledge about crystal growth obtained through these experiments will be described in detail below.

<Crystal growth technique 1>

First, a crystal growth technique according to the invention using existing crystal growth equipments will be explained with reference to the process flow of FIGS. 3A to 3E. In the first step, a $SiO_2$ film is formed on the (0001) plane of a sapphire substrate 1, for example. This step is performed by vapor phase growth using a monosilane gas and oxygen, for example. Specifically, a $SiO_3$ film is formed by vapor phase growth directly on the sapphire substrate. Then, a photoresist is coated on the surface of the $SiO_2$ film, and the region to be formed with openings is exposed to light in stripes and thus removed. Finally, the openings are formed by wet-etching the $SiO_2$ film using hydrofluoric acid (HF) etching solution (etchant). These steps use a technique normally employed for a Si device and no drawings therefor are prepared.

The third and subsequent steps will be explained with reference to FIGS. 3A to 3D. First, the sapphire substrate 1 carrying the $SiO_2$ film 4 formed with an opening 40 (hereinafter called the $SiO_2$ film mask 4) in the second step is placed in a furnace for nitride semiconductor crystal growth. The latest model of this crystal growth furnace is described in JP-A-4-164895 (U.S. patent Ser. No. 5,334,277). The present inventors, however, employed an existing MOCVD equipment using one of raw gas supply lines for supplying ammonia gas. In the third step, the furnace pressure is set to a level approximate to the atmospheric pressure (760 Torr). An ammonia ($NH_3$) gas and a trimethyl gallium (TMG) gas were continuously supplied into the furnace at the rate of 2 to 5 liters (2 to 5 SLM) per minute and at the rate of about 10 cc per minute (10 sccm), respectively. The sapphire substrate set in the furnace was heated to the growth temperature of 1030° C.

Figure 3A:
Figure 3B:
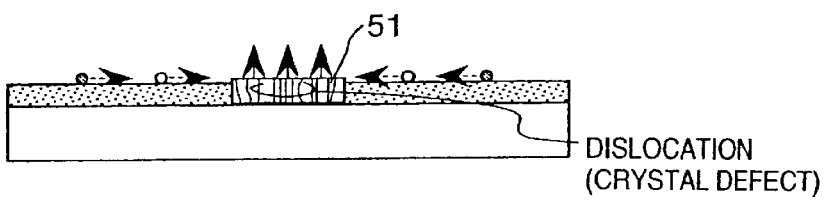
Figure 3C:
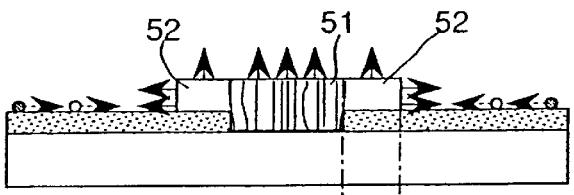
Figure 4A:
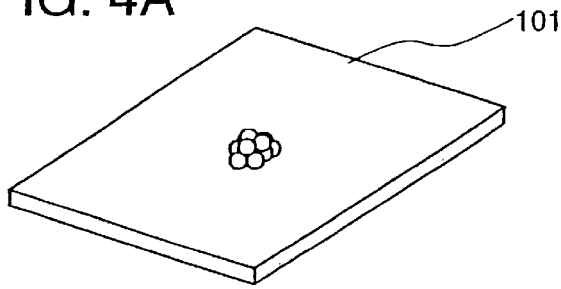
FIGS. 4A to 4E are diagrams chronologically showing the growth of a GaN crystal on an amorphous insulator according to the basic concept of the invention.
Figure 4B:
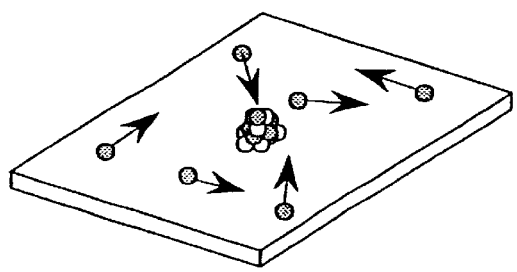
Figure 4C:
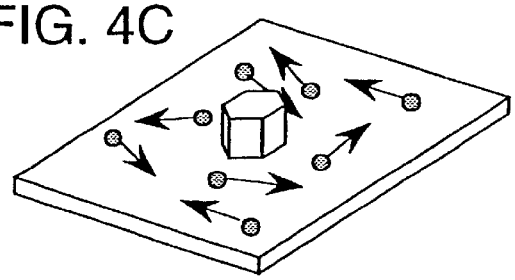
Figure 4D:
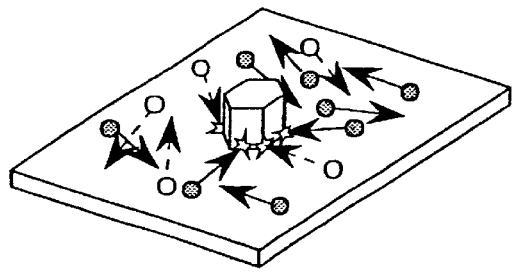
Figure 4E:
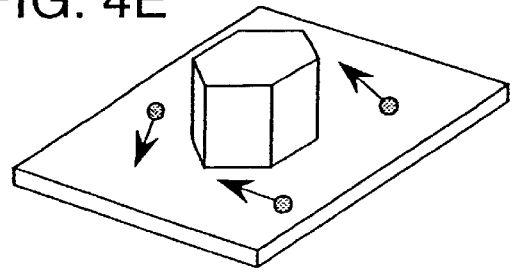

FIGS. 3A to 3C chronologically show the growth of a GaN crystal constituting a nitride semiconductor device in the third step. First, microcrystals 50 of GaN are formed on the surface of the sapphire substrate in the opening 40 (FIG. 3A). The GaN microcrystal looks like a hexagonal column erected on the substrate. At this time point, the sapphire substrate is recovered from the furnace and observed under the scanning electron microscope (SEM). It was confirmed that the direction of c-axis is varied from one microcrystal to another. As already described, the epitaxial growth of a nitride semiconductor crystal proceeds along c-axis, and therefore different microcrystals 50 grow in different directions as indicated by arrows in FIG. 3A.

Consequently, with the progress of growth of microcrystals, the growing surfaces of crystals come to rub and bite each other. The result is that although a plurality of GaN crystals grown from the microcrystals are coalesced in the opening, a multiplicity of dislocations are caused by the stress exerted on the surfaces and internal parts of the microcrystals thus coalesced (FIG. 3B). The GaN crystals grown this way in the opening have the crystal structure thereof defined by the atomic arrangement in the heterojunction interface with the sapphire substrate, and therefore is called a heteroepitaxial region 51 for convenience' sake.

When this heteroepitaxial region 51 grows to such an extent as to protrude out of the opening, the homoepitaxial growth of a GaN crystal begins along the upper surface of the $SiO_2$ film mask 4 with each side of the heteroepitaxial region 51 along the edge of the opening 40 as a new growth interface (FIG. 3C). In other words, the GaN crystal formed on the upper surface of the $SiO_2$ film mask has a different growth mechanism from the crystals grown in and above the opening. The present inventors will refer to the regions formed on the $SiO_2$ film mask 4 as homoepitaxial regions 52 for convenience' sake. The sectional view of FIG. 3C, as viewed from the upper surface side of the $SiO_2$ film mask 4, shows that unevennesses are formed at an angle of about 120° in the growth interface of the homoepitaxial region 52 (FIG. 3D). This stems from the fact that the heteroepitaxial region 51 grows in the form of hexagonal column. The time lag between the growth interfaces (sides of the hexagonal column) of the heteroepitaxial region 52 to protrude from the edge of the opening onto the upper surface of the $SiO_2$ film mask constitutes the difference of the time when the homoepitaxial regions 52 begin to grow. This time lag is reflected in the shape of the growth interface of each homoepitaxial region. An idea for avoiding such unevennesses of the growth interfaces is forming the opening as a hexagonal column. This idea will be described later in related sections.

Figure 19:
FIG. 19 is a photograph corresponding to FIG. 3D taken under transmission electron microscope (TEM).

The present inventors observed the GaN crystal fabricated in the above-mentioned steps under electron microscope. It was discovered that the density of crystal defects in the homoepitaxial regions 52 is considerably lower than that in the heteroepitaxial region 51 as described above. FIG. 19 is a photograph taken under the transmission electron microscope and corresponds to FIG. 3D. The line running vertically at about the center of the photograph represents an edge of the opening of the $SiO_2$ film mask. This photo shows that a multiplicity of defects in the form of streaks exist only on the left side but not on the right side of the opening edge. Specifically, the density of crystal defects is in the range of $10^8$ to $10^{11}$ $cm^{-2}$ for the left region (the heteroepitaxial region 51 in FIG. 3D) and in the range of $10^4$ to $10^5$ $cm^{-2}$ for the left region (the homoepitaxial regions 52 in FIG. 3D). The coalescing of GaN crystals in the process of growth was confirmed also in the homoepitaxial region 52. This phenomenon was observed when a plurality of openings were formed as parallel stripes. Even in the case where the growth interface has unevennesses as described above, however, the GaN crystals in the homoepitaxial regions were coalesced without inducing no substantial crystal defects, and the defect density of the junction was at most about $10^6$ to $10^7$ $cm^{-2}$.

Figure 6A:
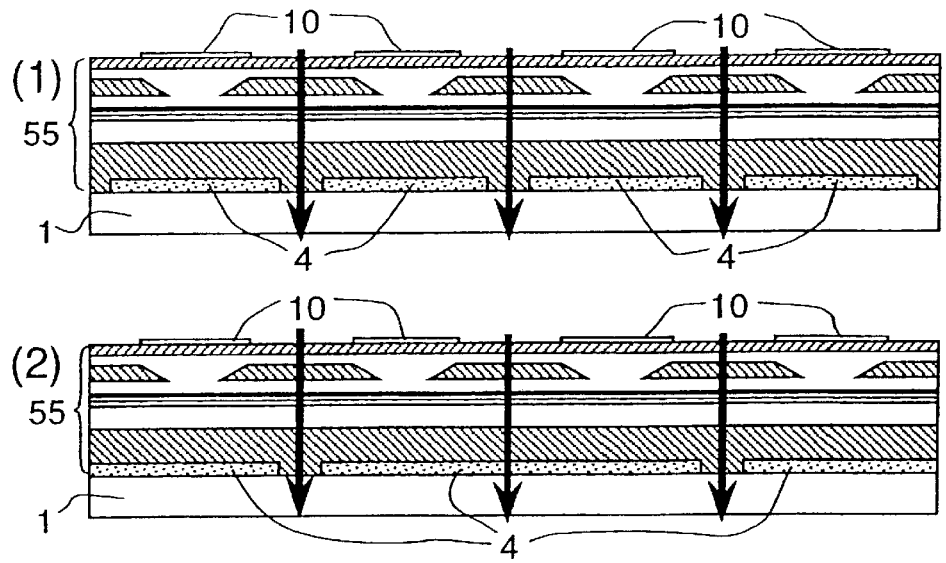
FIG. 6A is a diagram for explaining a mass production process of semiconductor devices to which the crystal growth technique according to the invention is applied.
Figure 6B:
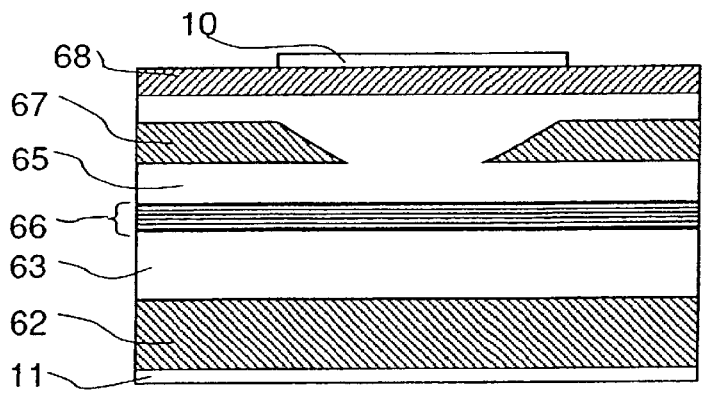
FIG. 6B is a longitudinal sectional view of an example of a completed semiconductor device.
Figure 6C:
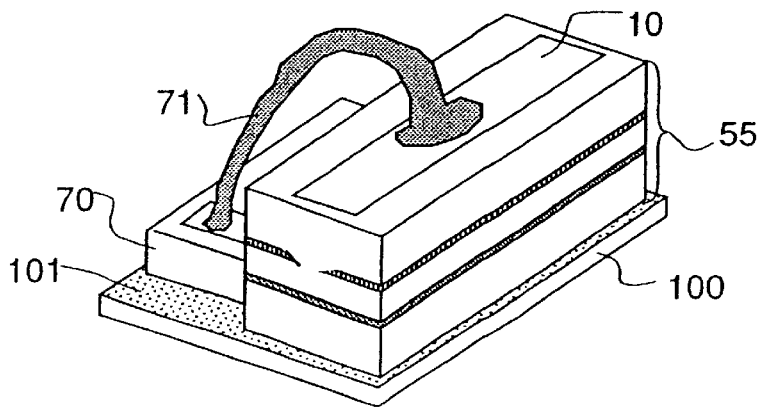
FIG. 6C is a perspective view of another example of a completed semiconductor device.

With regard to the above-mentioned new technique of growing crystal for a nitride semiconductor using the $SiO_2$ film mask 4, the inventors propose the processes shown in (1) and (2) of FIGS. 6A as a mass production engineering for a semiconductor device using a nitride semiconductor. Both of the methods utilize the crystal coalescence of the homoepitaxial regions 52. Specifically, $SiO_2$ film (or amorphous insulator) masks 4 having a plurality of openings are formed on a substrate member 1 made of sapphire or a material having a crystal structure of a hexagonal system thereby to form a multilayer structure 55 composed of a nitride semiconductor. FIGS. 6A to 6C show a semiconductor laser device as an example, which can alternatively be an optical switch or a field effect transistor with equal effect. In short, a region for performing the device operation is formed on the homoepitaxial region by injecting carriers. For a device having a performance affected easily by a minor crystal defect, it is desirable to employ the configuration of (2) of FIG. 6A in which a region for device operation is formed on other than the upper surface of the crystal coalescing region on the masks 4. In both (1) and (2) of FIG. 6A, the dicing is effected in the direction of arrows after forming electrodes 10 thereby to produce a discrete semiconductor laser device as a unit shown in FIG. 6B. This semiconductor laser device is formed by stacking an optical waveguide layer 63 including a n-type $Al_{0.15}Ga_{0.85}N$ layer and a n-type cladding layer 62 with n-type impurities doped into the homoepitaxial region (GaN layer) formed on the mask 4, an active layer 66 including an undoped InGaN multiple quantum well layer, an optical waveguide layer (not shown) made of p-type $Al_{0.15}Ga_{0.85}N$, a capping layer 68 of p-type GaN containing impurities higher in concentration than the p-type cladding layer 65, and a p-side electrode 10. The carrier injection region in the active layer 66 thus is limited by a n-type GaN layer 67 (containing impurities of the same level as the n-type cladding layer) formed by being buried in the p-type cladding layer 65. Specifically, in this device, the active layer under the region not formed with the n-type GaN layer 67 participates in the substantive device operation, and therefore this portion is displaced from the upper portion of the heteroepitaxial region, as obvious from (1) and (2) of FIG. 6A. In the mass production engineering shown in (1) and (2) of FIG. 6A, the substrate 1 is lapped and the lower surface of the n-type cladding layer is exposed before cutting out a discrete device. The n-side electrode 11 can thus be formed on the particular lower surface. The device structure shown in FIG. 6B represents an example fabricated in this manner.

<Crystal growth technique 2>

Now, another crystal growth technique based on the present invention will be explained with reference to the process flow shown in FIGS. 5A to 5D. This prototype experiment was conducted in order to introduce Knowledge 5 described above.

Figure 5A:
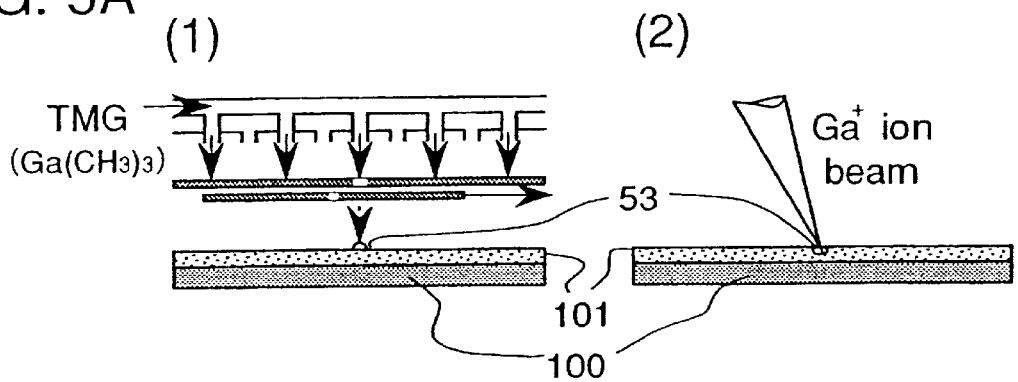
FIGS. 5A to 5D are diagrams chronologically showing the crystal growth by the crystal growth technique 2 according to the invention.

First, a Si substrate 100 is thermally oxidized in an oxygen environment thereby to form an amorphous $SiO_2$ film 101 on the surface thereof. Then, in the first step, Ga atoms constituting a nucleus for the growth of a GaN film are formed on the $SiO_2$ film. As a means for executing the first step, a furnace having a sectional structure as shown in (1) of FIG. 5A is used. This furnace has a plurality of gas-supplying nozzles arranged two-dimensionally in opposed relation to a holder (not shown) for mounting the Si substrate. The gas-supplying nozzles are arranged on one of two types of gas supply lines. Also, two plates with an aperture are adapted to be inserted between the holder and the gas-supplying nozzles. This furnace having a unique arrangement of gas-supplying nozzles is called a furnace with shower head nozzles for convenience' sake.

First, the interior of the furnace with shower head nozzles is purged by a nitrogen gas constituting an inert gas, and after thus setting the internal pressure of the furnace to about 760 Torr, the Si substrate 100 with the surface thereof oxidized is placed therein. Then, two plates with an aperture are inserted between the Si substrate and the gas-supplying nozzles. In the process, the aperture of the upper plate is set in registry with the nucleation position of the $SiO_2$ film 101, and the aperture of the lower plate is displaced out of registry with that of the upper plate. Under this state, a trimethyl gallium (TMG) gas is continuously supplied at the rate of 10 sccm from the upper supply line while at the same time sliding the lower plate in the direction indicated by arrow in (1) of FIG. 5A, thus instantaneously supplying the TMG gas onto the surface of the $SiO_2$ film 101. As a result, a nucleus 53 composed of a droplet of Ga atoms is formed only at the nucleation position on the surface of the $SiO_2$ film 101, thereby substantially preventing the Ga atoms from being attached over the entire surface.

Figure 5B:
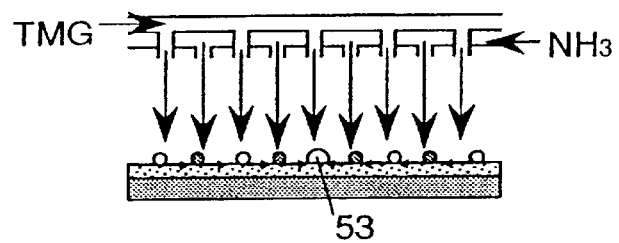
Figure 5C:
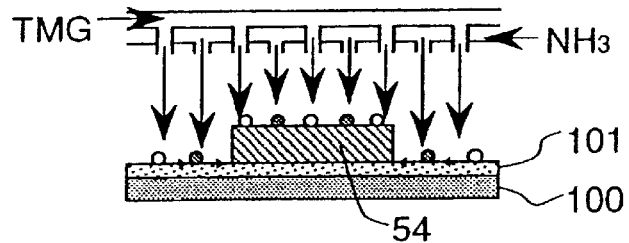
Figure 5D:
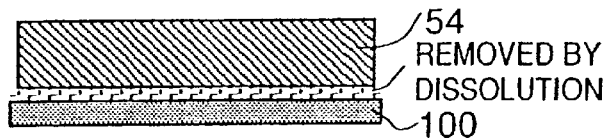
Figure 20:
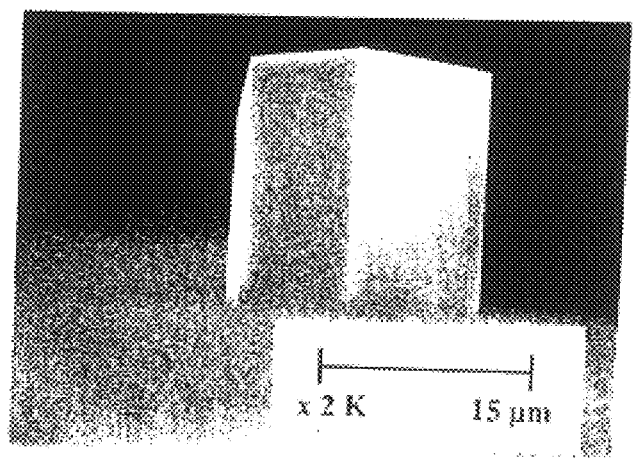
FIG. 20 is a photograph corresponding to FIG. 5C taken under scanning electron microscope (SEM).

In the second step, an ammonia ($NH_3$) gas is supplied at the rate of 2 to 5 SLM from the lower supply line. Then, the two plates with an aperture are removed. At the same time, the Si substrate 100 is heated to about 1000° C. by way of the holder (FIG. 5B). By so doing, a GaN crystal begins to grow about the position formed with the nucleus 53, and a crystal 54 in the form of hexagonal column is formed on the $SiO_2$ film 101 (FIG. 5C). FIG. 20 is a photograph taken under the scanning electron microscope (SEM) and corresponds to FIG. 5C. It is seen that the GaN single crystal formed on the $SiO_2$ film 101 is in the shape of hexagonal column.

At this juncture, the inventors propose to suspend the crystal growth before the crystal 54 covers the whole surface of the $SiO_2$ film 101, to etch the surface portion of the $SiO_2$ film 101 not formed with the crystal 54 and thereby to form another semiconductor device made of a Si multiple stacked structure. According this technique, a device composed of the multilayer structure 55 of a nitride semiconductor and a driver circuit 70 for the device can be formed monolithically on the same Si substrate 100, as shown in FIG. 6C. A conductive semiconductor layer constituting the driver circuit 70 is formed in such a manner as to be coupled with the n-type semiconductor layer located at the lower part of the multilayer structure 55 (not shown), and a bonding member 71 is formed between the driver circuit 70 and the p-side electrode 10 located at the upper part of the multilayer structure 55, thereby realizing a hybrid device such as a semiconductor laser module.

In the second step, the crystal 54 is grown to a largest possible size on the surface of the $SiO_2$ film 101 (within the range not displaced out of the surface). After that, in the third step, the $SiO_2$ film 101 is melted by a HF etchant thereby to separate the crystal 54 and the Si substrate 100 from each other. As a result, a new substrate member composed of GaN single crystal is realized. This substrate member is lower in crystal defect density than SiC which is considered as the best material of a substrate for epitaxial growth of a nitride semiconductor. Consequently, the GaN substrate produced in the third step is superior to SiC in terms of lattice matching and prevention of dislocation in the process of fabricating a nitride semiconductor device.

An example of a semiconductor device formed using this substrate member is shown in FIG. 6B. The specification of this device is substantially identical to that of the semiconductor laser device described in "Crystal growth technique 1" above. This technique is different, however, in that a n-type cladding layer 62 doped with n-type impurities is composed of a GaN substrate doped with n-type impurities. In the case where a nitride semiconductor layer is epitaxially grown on a GaN substrate in this way, the lattice matching is easily secured between the stacked semiconductor layers. At the same time, even in the case of configuring a pseudomorphic device which exerts a compressive strain and a tensile strain on the semiconductor layer making up an optical crystal region, the defects due to the introduction of a lattice-mismatched layer can be easily suppressed.

The above-mentioned first step can also be executed by applying an ion beam, for instance. An example will be described with reference to (2) of FIG. 5A. A Si substrate 100 with an amorphous $SiO_2$ film 101 formed on the surface thereof is placed on a secondary ion mass spectrometer (SIMS), and Ga ions are irradiated on the surface of the $SiO_2$ film with an acceleration voltage of 1 kV and a dose of $1 \times 10^{13}$ ions/cm$^2$. The SIMS employed in this case is generally called a static SIMS which is used for measuring the first atomic layer and the adsorbed layer on specimen surface. This SIMS irradiates ions having a current density of $10^{-5}$ to $10^{-3}$ mA/cm$^2$ with an energy of 0.5 to 5 keV. Still another type of SIMS is available in which ions with a current density of 1 to 100 mA/cm$^2$ are irradiated with an energy of 5 to 30 keV. The latter equipment is used to sputter the specimen surface by ion irradiation and therefore is not suitable for forming a nucleus on the SiO$_2$ film.

For irradiating Ga ions on the surface of the SiO$_2$ film, the ion beam diameter was reduced by an ion optical system to 100 Å when reaching the surface of the SiO$_2$ film. The ions are irradiated for about a second. The irradiation time was regulated by deflecting the ion beam by a beam deflector mounted in the ion optical system. After forming the nucleus 53 composed of Ga atoms on the surface of the SiO$_2$ film in this way, the Si substrate 100 was recovered from the SIMS and transferred to the furnace with shower head nozzles to enter the second step. In the process, the furnace interior was purged by nitrogen (N$_2$) constituting an inert gas, and the plates with aperture were removed. After placing the Si substrate in the furnace with shower head nozzles, a trimethyl gallium (TMG) gas was supplied from the upper supply line at the rate of 10 sccm, and an ammonia (NH$_3$) gas from the lower supply line at the rate of 2 to 5 SLM. At the same time, the Si substrate 100 was heated to about 100° C. by way of the holder (FIG. 5B). The subsequent process is identical to that for the second step.

The above-mentioned method of forming a nucleus with an ion beam used the static SIMS. Any other equipment, however, can be used which is capable of irradiating an ion beam with the same amount of current and the same amount of energy (acceleration voltage). As compared with a method using the furnace with shower head nozzles in the first step, the method of forming a nucleus with an ion beam requires the additional process of transferring the Si substrate from the ion beam irradiation unit to the furnace with shower head nozzles (or a crystal growth furnace). Nevertheless, the latter method is more advantageous in that a nucleation region can be set arbitrarily and in that the plates with an aperture are not required for the furnace with shower head nozzles (i.e., the configuration of the furnace for crystal growth is simplified).

2. Application to Semiconductor Devices

A method of fabricating a semiconductor device using the crystal growth technique according to the invention described in "Introduction" above will be described in more detail below with reference to embodiments. Each embodiment will be explained using a semiconductor laser device constituting one of semiconductor optical devices as a model.

<Embodiment 1>

Figure 7A:
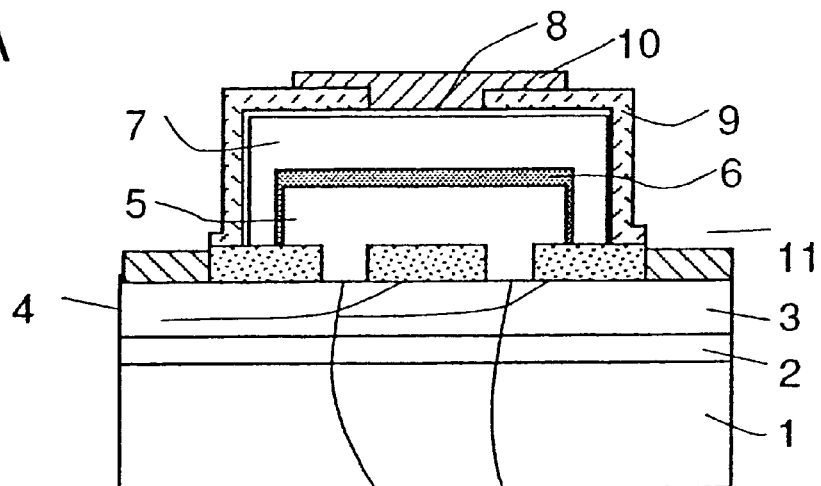
FIG. 7A is a diagram showing an example of a longitudinal section of a semiconductor optical device according to a first embodiment of the invention.
Figure 7B:
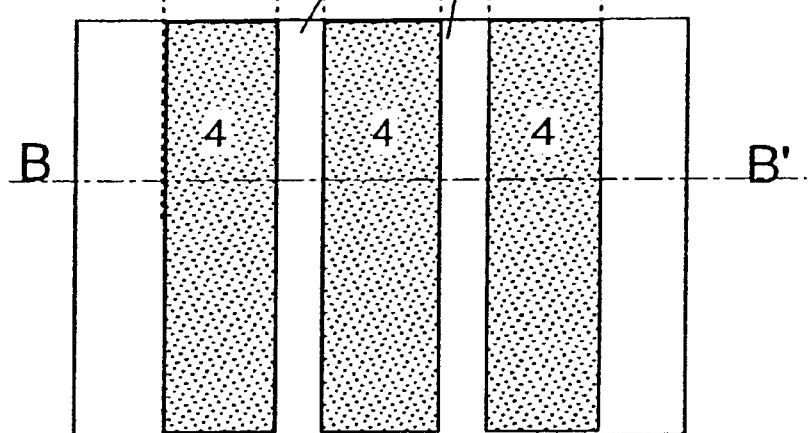
FIG. 7B is a top plan view of an insulator mask formed in the device shown in FIG. 7A.

A semiconductor device according to an embodiment of the present invention will be described with reference to FIGS. 7A and 7B. In FIG. 7A, a GaN buffer layer 2 and a n-type GaN optical waveguide layer 3 are grown as crystal by metal organic vapor phase epitaxy on a sapphire ($\alpha$-Al$_2$O$_3$) single-crystal substrate 1 having a (0001)C plane, for example. After that, a pattern (of openings) 40 having at least two striped window regions is formed for the insulator masks 4 as shown in FIG. 7B. In the process, the insulator masks are striped in the direction parallel to the (11–20)A plane of the sapphire substrate 1. Then, a n-type GaN optical waveguide layer 5 is selectively grown in each of the two window regions formed by the insulator mask patterns 4. The resulting two layers 5 are coalesced transversely into a flat, rectangular single n-type GaN optical waveguide layer 5 over the central insulator mask. Then, a compressive-strained multiple quantum well active layer 6 including an AlGaN separate confinement heterostructure layer, a GaN quantum barrier and a GaInN compressive-strained quantum well, a p-type GaN optical waveguide layer 7 and a p-type GaInN contact layer 8 are formed in that order. Next, insulator masks 9 are formed by lithography, and a pattern of the p-side electrode 10 and the n-side electrode 11 is deposited by evaporation. Finally, the surface of a cavity is cut off by cleaving the assembly in the direction perpendicular to the stripes, and a device is scribed off. In this way, a longitudinal section of the device (section taken in line B–B' in FIG. 7B) shown in FIG. 7A is produced.

According to this embodiment, a gain-guided structure can be produced by regulating the width of each insulator mask and the width of each window region and thus by setting the width of the active layer on the optical waveguide layer 5 to not less than 5 $\mu$m. Also, a refractive index-guided structure with a buried heterostructure can be produced by setting the width of the active layer in the range of 1 to 3 $\mu$m in similar fashion. In this technique, the crystal defect density was in about the same range of $10^9$ to $10^{11}$/cm$^2$ as in the conventional method in the window regions of the insulator masks for selective growth. On the insulator masks, however, homoepitaxial growth could be realized and the crystal defect density thereby could be reduced to the range of $10^4$ to $10^5$/cm$^2$ or less. In this device structure, the current blocking is effected by an insulators 9. Further, when viewed transversely of the active layer 6, the internal optical loss is considerably varied between the central region of the active layer 6 and the outer regions of the active layer above the insulator masks. It follows, therefore, that the laser beam is guided also with a loss thereby to restrict the propagation region. In the device having the refractive index-guided structure with a buried heterostructure according to this embodiment, an operation with lower threshold current can be achieved than the device having the gain-guided structure. The threshold current can be reduced to ⅓ to ¼ as compared with the device having the gain-guided structure. This device also performs the lasing operation with lower threshold current and higher efficiency than the conventional device formed by bulk growth, and has a lasing wavelength in the range of 410 to 430 nm at room temperature.

A variation of the present embodiment will be explained with reference to FIG. 7C (sectional view taken in line B–B' in FIG. 7B). The process for fabricating the device and the pattern of the insulator masks 40 are substantially identical to those described above. After growing up to the p-type contact layer 8, however, a ridge stripe is formed on the p-type optical waveguide layer 7 by lithography and etching. In the process, the bottom width of the ridge stripe is set to the range of 3 to 7 $\mu$m. Further, a buried layer 12 is formed on each side of the ridge stripe. This buried layers 12 can be formed either as n-type Ga current-blocking layers by selective growth using an insulator or directly as a dielectric insulator. The process for forming the insulators 9 and the electrodes 10, 11 is the same as described above, with the result that the vertical sectional view of the device shown in FIG. 7C is obtained.

Figure 7C:
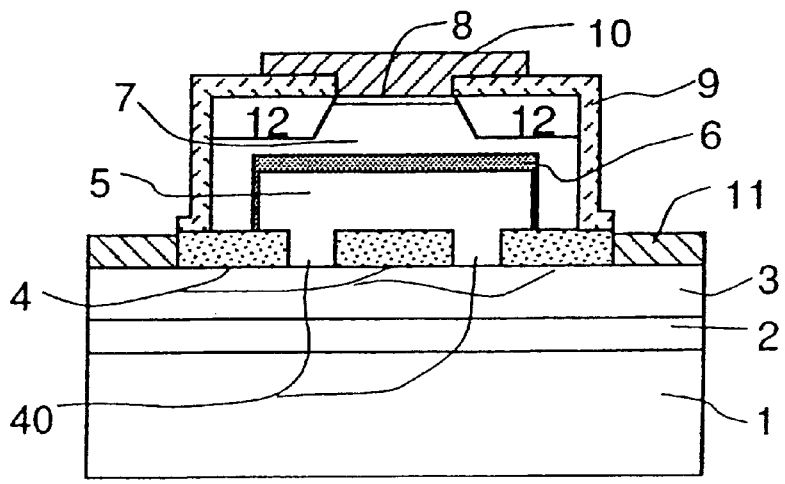
FIG. 7C is a longitudinal sectional view of another example of a device.

The configuration shown in FIG. 7C has a ridge stripe structure for injecting currents only at the central region of low defect density and low optical loss in the optical active layer. It is therefore possible to attain effective current injection and stable refractive index distribution. As a result, a threshold current value was obtained equal to or lower than that of the refractive index-guided structure with buried heterostructure shown in FIG. 7A. This device performs the lasing operation with low threshold current and high efficiency, and the lasing wavelength thereof at room temperature is in the range of 410 to 430 nm.

<Embodiment 2>

Figure 8A:
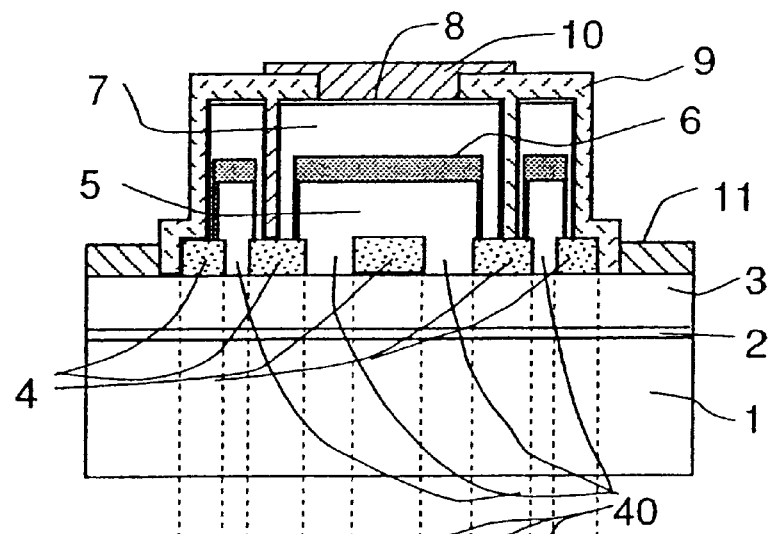
FIG. 8A is a longitudinal sectional view of an example of a semiconductor optical device according to a second embodiment of the invention.
Figure 8B:
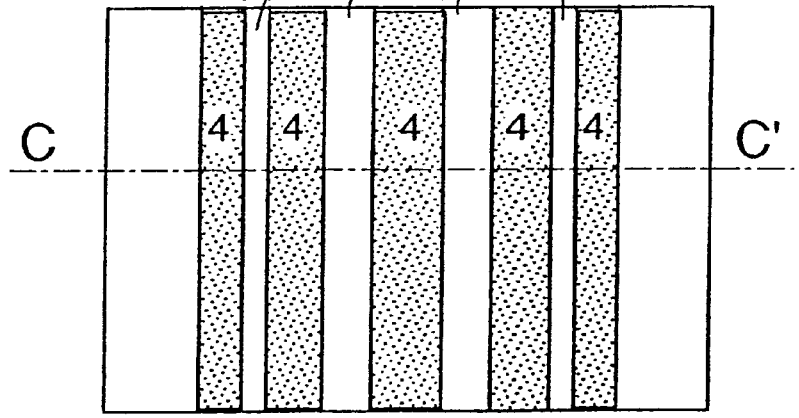
FIG. 8B is a top plan view of an insulator mask formed in the device shown in FIG. 8A.

A semiconductor device according to another embodiment of the invention will be described with reference to FIGS. 8A and 8B. The device is fabricated in a way similar to the first embodiment, except that in addition to the insulator masks for the waveguide structure according to the first embodiment, dummy patterns are used to form a pattern (openings 40) of the insulator masks 4 shown in FIG. 8B. The width and interval of the insulator masks are set in such a way as to prevent the crystal layers grown on the dummy patterns from being coalesced with the crystal layer of the waveguide formed at the central portion. Also, the insulators 9 are covered for preventing a current from flowing in the crystal layers grown on the dummy pattern (openings on the sides). In the remaining points, the same process is performed as in the first embodiment to produce the vertical sectional view of the device shown in FIG. 8A (the sectional view taken in line C–C' in FIG. 8C).

According to this embodiment, crystal layers constituting dummies are formed on the waveguide structure of the first embodiment for improving the quality and geometry of the crystal layer formed on the central waveguide. Unusual growth and unstable growth rate were thus obviated and a rectangular optical waveguide having flat and smooth upper and side surfaces could be formed without considerably affecting the conditions for crystal growth outside of the dummy pattern. As a result, the laser beam can be guided with lower loss, and the semiconductor device can be operated with lower threshold current and higher efficiency. It became thus possible to reduce the threshold current to at least $\frac{2}{3}$ to $\frac{1}{2}$ as compared with the first embodiment. This device performs the lasing operation in the lasing wavelength of 410 to 430 nm at room temperature.

Figure 8C:
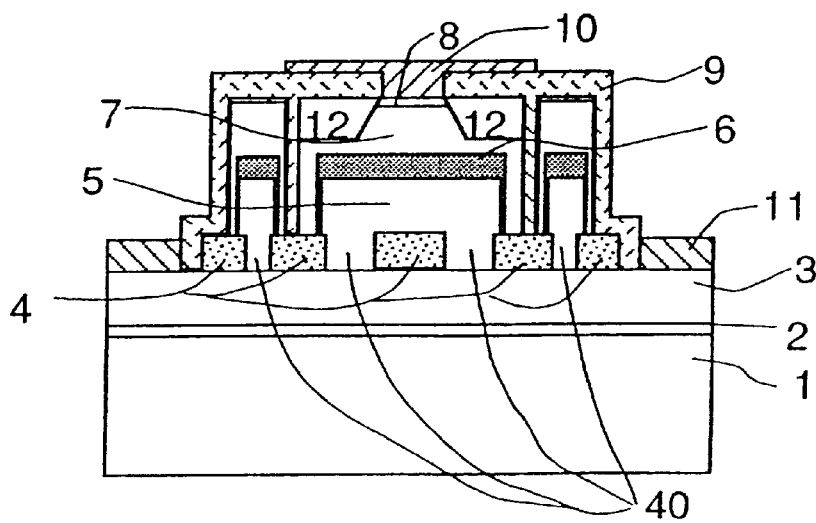
FIG. 8C is a longitudinal sectional view of another example of a device.

FIG. 8C is a sectional view (the section taken in line C–C' in FIG. 8B) of a variation of the present embodiment. This device is fabricated through substantially the same process as the device shown in FIG. 8A. The difference lies, however, in that after forming the layer 8, buried layers (such as current-blocking layers) 12 are formed like in the device shown in FIG. 7C. Further, insulators 9 are covered in order to prevent a current from flowing in the crystal layers grown on the dummy pattern. As compared with the device in FIG. 7C, the device shown in FIG. 8C makes it possible to improve the quality and geometry of the crystal layer formed on the central waveguide. The threshold current can also be reduced at least to $\frac{2}{3}$ to $\frac{1}{2}$ of the threshold current for the device shown in FIG. 7C. This device performs the lasing operation with the lasing wavelength in the range of 410 to 430 nm at room temperature.

<Embodiment 3>

Figure 9A:
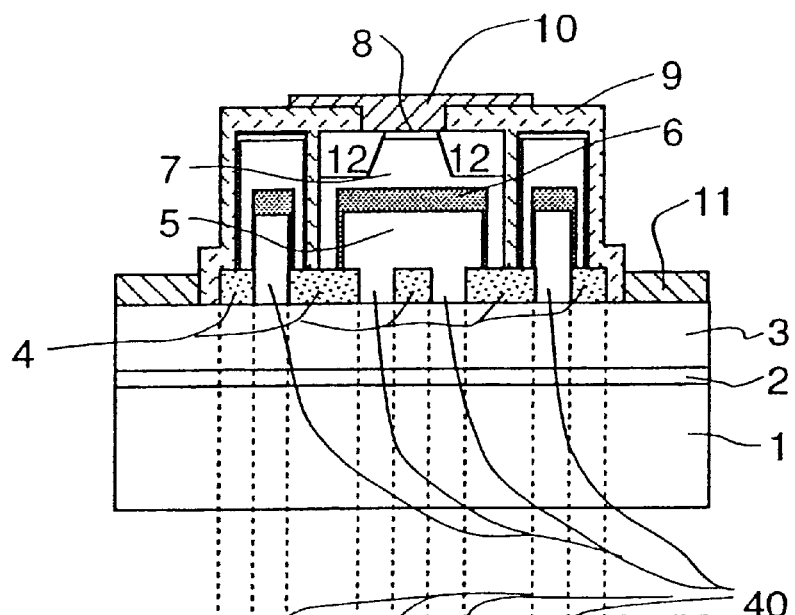
FIG. 9A is a longitudinal sectional view of an example of a semiconductor optical device according to a third embodiment of the invention.
Figure 9B:
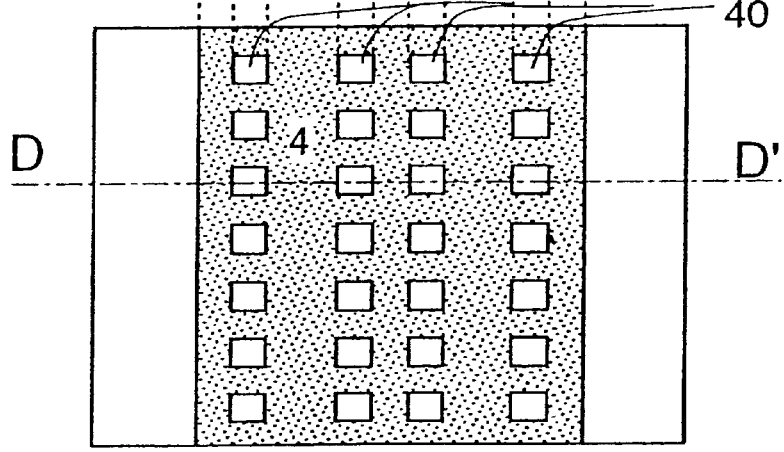
FIG. 9B is a top plan view of an insulator mask formed in the device shown in FIG. 9A.

A semiconductor device according to still another embodiment of the invention will be described with reference to FIGS. 9A and 9B (FIG. 9A is a sectional view taken in line D–D' in FIG. 9B). The device is formed by crystal growth in the same manner as the second embodiment shown in FIG. 8C. The pattern (openings 40) of the insulator mask 4, however, is not striped as shown in FIG. 9B, but includes a plurality of rectangular openings (window regions) arranged two-dimensionally at predetermined intervals. According to this embodiment, as compared with the fourth embodiment, the crystal defect density of the optical active layer 6 at the central portion of the waveguide could be reduced further. The stripe structure for guiding the laser beam is formed in the central region of the active layer corresponding to the portion on the central insulator mask to block the currents. The crystal defect density, however, is desirably small over the entire optical active layer. For this purpose, it is effective to increase the proportion of which the area where homoepitaxial growth is possible represents of the whole area of the active layer. In fabricating the waveguide structure at the central portion, therefore, the proportion of the area occupied by the rectangular window regions in the insulator mask for selective growth is reduced as far as possible. This device, as compared with the device of FIG. 8C, can reduce the crystal defects of the optical active layer and the optical waveguide layer, and therefore, can assure an operation with still lower threshold current and still higher efficiency. The threshold current was reduced to $\frac{1}{2}$ to $\frac{1}{3}$ as compared with the device of FIG. 8C. This device performs the lasing operation with the lasing wavelength in the range of 410 to 430 nm at room temperature.

A variation of this embodiment will be explained with reference to FIG. 9C. In this example, the section taken in line D–D' of the device is similar to that in FIG. 9A, but the pattern of the openings 40 of the insulator mask 4 is different. Specifically, a pattern of rectangular openings is formed on the two sides for dummy crystal growth, whereas a pattern of openings in the shape of equilateral hexagon are formed for selective growth corresponding to the central waveguide structure.

The shape of the openings will be briefly described. According to this embodiment, the openings (also called the window regions) in the insulating film 4 for exposing the surface of the crystal region constituting a base are shaped in quadrangle such as square or rectangle or in hexagon including equilateral hexagon, and arranged at predetermined regular intervals. As a result, the crystal layers that have grown out of adjacent openings toward each other by homoepitaxial growth on the insulator are easily coalesced with each other on the particular insulator thereby to form a single optical waveguide or a single optical active layer. Especially, a nitride semiconductor material constituting a III–V semiconductor having a hexagonal symmetry structure epitaxially grows while maintaining the form of hexagonal column in each opening. Therefore, the interface where each homoepitaxial growth starts on the insulator is also formed as a side of the hexagonal column.

Figure 9C:
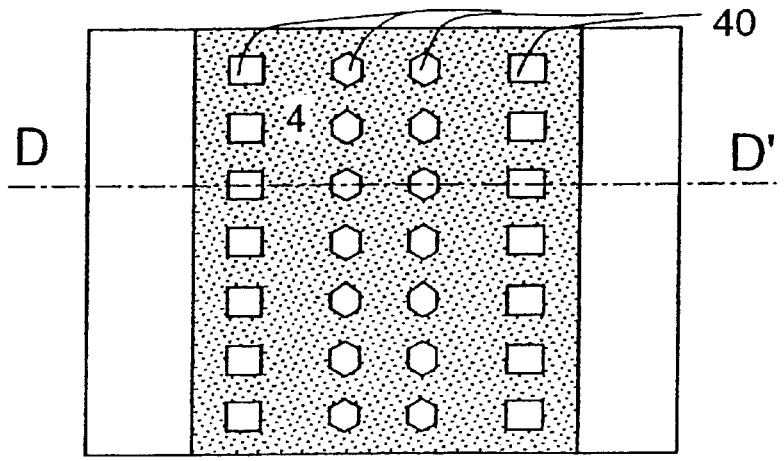
FIG. 9C is a top plan view showing another example of an insulator mask.

With the insulator mask 4 shown in FIG. 9C reflecting the property of growth of the hexagonal crystal system, the crystal layers grown in the openings (window regions) in the shape of equilateral hexagon are easily coalesced with each other, thereby considerably reducing the chance of crystal defects developing at the junctions thereof. As a result, the crystal defect density of the optical active layer and the optical waveguide layer making up the central waveguide structure is reduced below that of the device employing the insulator mask of FIG. 9B. Thus, as compared with the insulator mask of FIG. 9B, an operation with low threshold current and high efficiency becomes possible with the threshold current being decreased to the range of $\frac{2}{3}$ to $\frac{1}{2}$. This device also performs the lasing operation with the lasing wavelength in the range of 410 to 430 nm at room temperature.

<Embodiment 4>

Figure 10A:
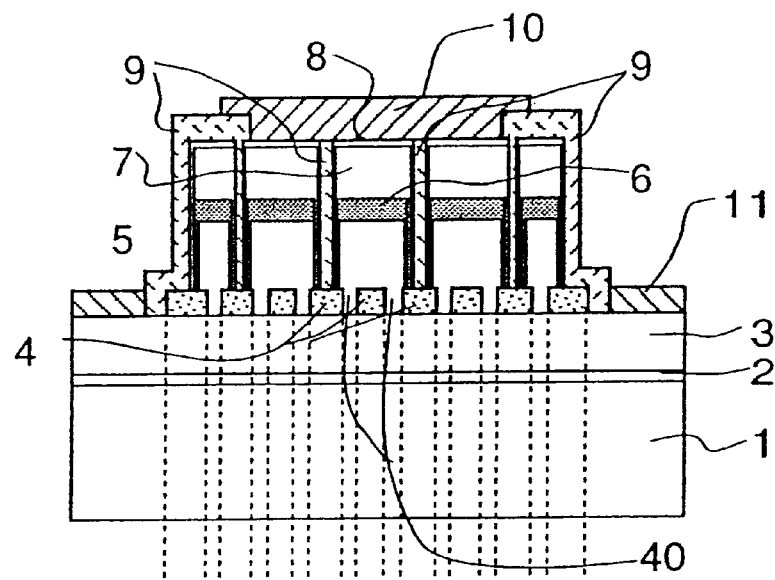
FIG. 10A is a longitudinal sectional view of an example of a semiconductor optical device according to a fourth embodiment of the invention.
Figure 10B:
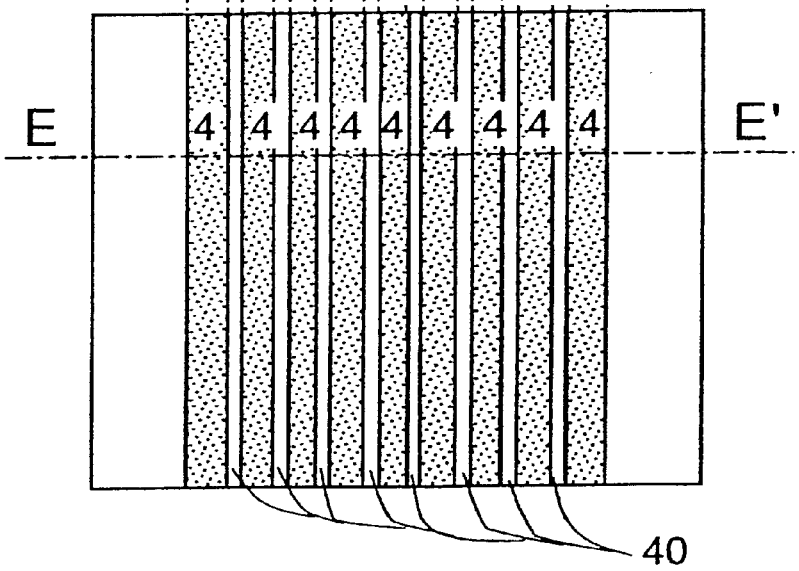
FIG. 10B is a top plan view of an insulator mask formed in the device shown in FIG. 10A.

Yet another embodiment of the invention will be described with reference to FIGS. 10A and 10B. The device is fabricated in a similar manner to the second embodiment. As shown in FIG. 10B, however, a pattern of openings 40 of the insulator masks 4 are arranged in juxtaposition to form a central waveguide structure in an array of stripes. As a result, the central waveguide structure of the second embodiment is formed in a plurality of stripes arranged in parallel thereby to make up a phased array waveguide structure. FIG. 10A is a sectional view taken in line E–E' in FIG. 10B.

According to this embodiment, the laser beam that has propagated to three central waveguides can be output in a fundamental mode satisfying the phase matching conditions. Thus, an operation of higher output is realized than in the first to third embodiments, and an output is at least three to five times as high as the maximum optical output produced in the second embodiment. This device performs the lasing operation with the lasing wavelength in the range of 410 to 430 nm at room temperature.

<Embodiment 5>

Figure 11A:
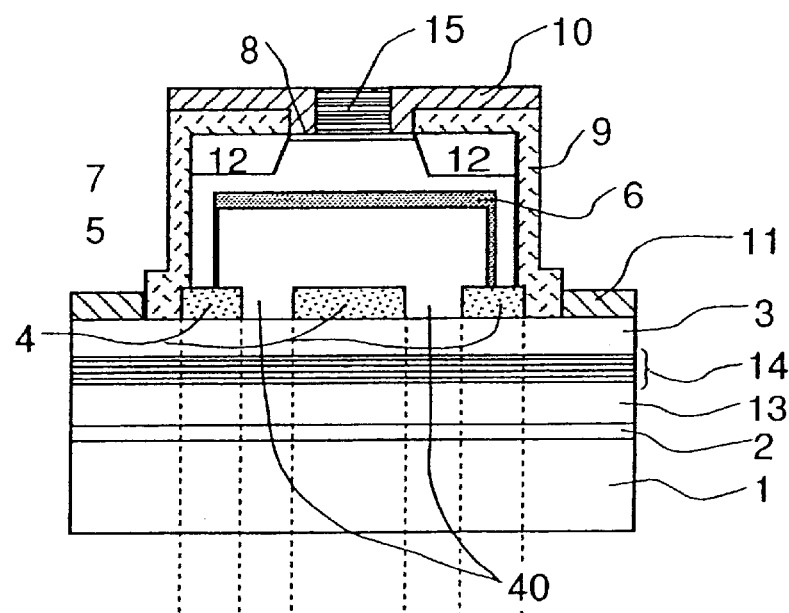
FIG. 11A is a longitudinal sectional view of an example of a semiconductor optical device according to a fifth embodiment of the invention.
Figure 11B:
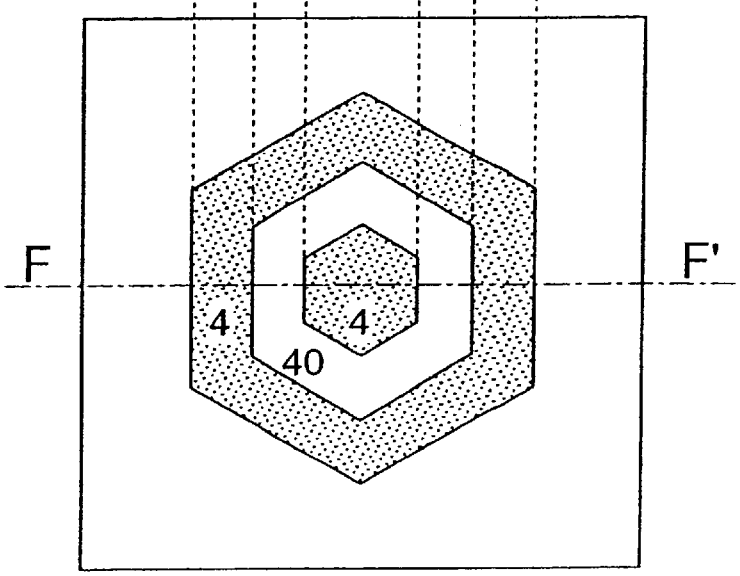
FIG. 11B is a top plan view of an insulator mask formed in the device shown in FIG. 11A.

A further embodiment of the present invention will be explained with reference to FIGS. 11A and 11B. This device is fabricated in a substantially similar manner to the first embodiment. In this embodiment, however, the first step taken is to form a GaN buffer layer 2, an undoped GaN layer 13, a high reflective DBR (Distributed Bragg Reflector) mirror 14 of undoped GaInN/AlGaN, and a n-type GaN optical waveguide layer 3, for example, by crystal growth on the substrate 1. Further, as shown in FIG. 11B, the device includes insulator masks in the shape of equilateral hexagon and window regions arranged around the peripheries of the insulator masks. Then, after forming up to the layer 8 as in the first embodiment, a high reflective DBR mirror 15 of undoped GaInN/AlGaN is grown selectively. The high reflective DBR mirror 15, like the high reflective DBR mirror 14, is formed of a plurality of GaInN layers and AlGaN layers stacked alternately to constitute a multilayer structure.

In fabricating a semiconductor laser device having a vertical cavity structure (as defined later) as in the present embodiment, the element composition (Ga:In or Al:Ga) of at least one of the GaInN layer and the AlGaN layer of the high reflective DBR mirrors 14, 15 is preferably changed thereby to differentiate the overall reflectivity of each multilayer structure. In the present embodiment with the upper surface of the high reflective DBR mirror 15 as an emission end of the laser beam, for example, the reflectivity of the high reflective DBR mirror 15 is preferably lower than that of the high reflective DBR mirror 14. Also, in the case where the active layer 6 has a strained quantum well structure or a strained superlattice structure, the high reflective DBR mirror 14 can also be used for stress compensation of the buffer layer 2 and the active layer 6 formed on the substrate.

Let us return to the process for fabricating a semiconductor laser device.

After a ridge stripe is formed by etching off the layers 15, 8 and 7, the layer 12 is buried to form the insulator 9. The high reflective DBR mirror 15 located above is formed as a dielectric high reflective DBR mirror and etched as shown in FIG. 11A after forming the insulator 9. A p-side electrode and a n-side electrode are then deposited by evaporation, and a cavity mirror is fabricated by cleaving in the direction perpendicular to the stripe. The device is separated by being scribed there to produce the vertical section of the device shown in FIG. 11A (the section taken in line F–F' in FIG. 11B).

According to the present embodiment, a waveguide can be formed on the central insulator mask by a crystal layer in the shape of equilateral hexagon having a flat and smooth upper surface. An optical active layer is formed on this optical waveguide, thereby producing a vertical cavity structure for surface emitting (a cavity structure for lasing formed in the direction substantially perpendicular to the main surface of the substrate 1). The semiconductor laser device according to this embodiment has a functional feature of generating a laser beam in the direction perpendicular to the main surface of the substrate 1. In this respect, the present embodiment is different in configuration from the semiconductor laser device according to the first to fourth embodiments described above in which a cavity structure for lasing is formed substantially in parallel to the main surface of the substrate 1. In this device, the reflectivity of the end surface (the upper surface of the high reflective DBR mirror 15) can be set stably at a high value of not less than 95 to 99% due to the provision of the high reflective DBR mirror 15. As compared with the devices shown in the first to fourth embodiments (having a laser emitting end surface on the side of the active layer), the present embodiment can minimize the threshold current. In fact, the threshold current can be reduced at least to $1/10$ to $1/30$ that for the device of the third embodiment. The device according to this embodiment performs the lasing operation with the lasing wavelength in the range of 410 to 430 nm at room temperature.

<Embodiment 6>

A yet further embodiment of the invention will be explained. According to this embodiment, in place of a sapphire ($\alpha$-Al$_2$O$_3$) substrate, a substrate 1 is made of n-type silicon carbide ($\alpha$-SiC) having a hexagonal symmetry structure with the substrate surface orientation in the (0001)C plane, and a n-type buffer layer is formed on the substrate of n-type silicon carbide. The device structure is fabricated in the same process as that of the first to seventh embodiments, thereby producing a section of the device.

According to this embodiment, the substrate has a conductivity. Therefore, the substrate can be mounted in such a manner that the n-side electrode is deposited by evaporation on the lower surface thereof having a junction formed by crystal growth. In this way, current can be supplied to the n-side electrode on the lower surface of the substrate from the p-side electrode on the upper surface of the substrate through a nitride semiconductor. The heat radiation can thus be remarkably improved. This embodiment can produce a laser device which operates at a higher temperature than the other embodiments. This device performs the lasing operation with the lasing wavelength of 410 to 430 nm at room temperature.

<Embodiment 7>

Still another embodiment of the invention will be described with reference to FIGS. 12A and 12B. This embodiment, though geometrically similar to the semiconductor device described with reference to the first to fourth embodiments, discloses a configuration suitable for securing a large width of an active layer.

Figure 12A:
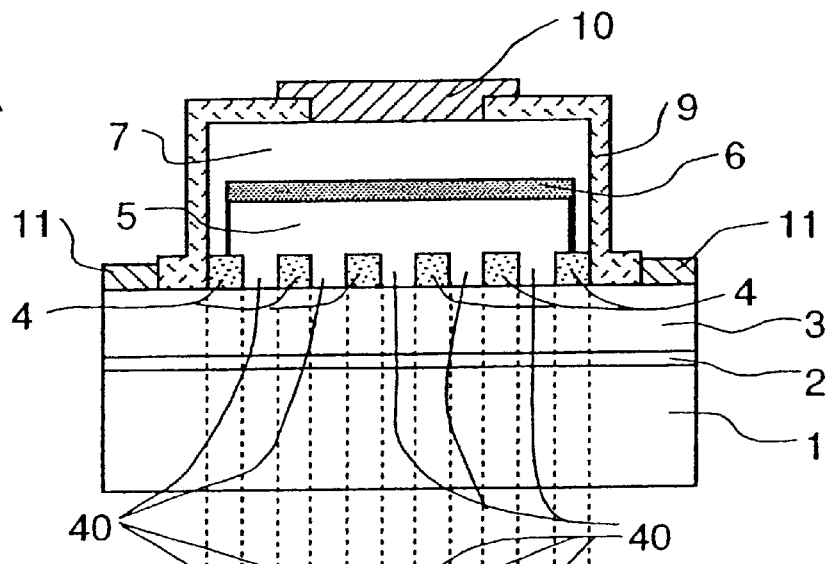
FIG. 12A is a longitudinal sectional view of an example of a semiconductor optical device according to a seventh embodiment of the invention.
Figure 12B:
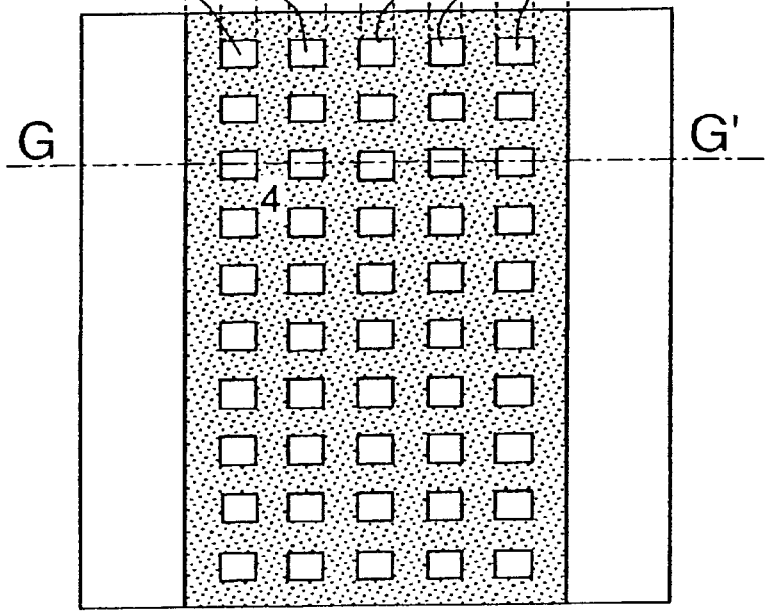
FIG. 12B is a top plan view of an insulator mask formed in the device shown in FIG. 12A.

In FIG. 12A, a GaN buffer layer 2 and a n-type GaN optical waveguide layer 3 are formed with crystal grown by the metal organic vapor phase epitaxy on a sapphire ($\alpha$-Al$_2$O$_3$) single-crystal substrate 1 having the (0001)C plane, for example. After that, a pattern of rectangular window regions 40 of an insulator mask 4 are formed in grid by lithography and etching. In the process, the insulator mask 4 having the window regions is set with the longitudinal direction thereof perpendicular to the (11–20)A plane of the $\alpha$-Al$_2$O$_3$ substrate 1. Then, a n-type GaN optical waveguide layer 5 is formed by continuing selective crystal growth in each window region until the crystals thus grown are coalesced transversely into a single flat optical waveguide layer. Immediately after that, a compressive-strained multiple quantum well active layer 6 including an AlGaN separate confinement heterostructure layer, a GaN quantum barrier, a GaInN quantum well, and a p-type GaN optical waveguide layer 7 are formed in that order. Then, an insulator mask 8 is formed by lithography. Further, a pattern of a p-type electrode 10 and a n-type electrode 11 is deposited by evaporation. Finally, a cavity mirror is fabricated by cleaving in the direction perpendicular to the waveguide stripe, and the device is scribed off thereby to produce a longitudinal section of the device shown in FIG. 12A (the section G–G' in FIG. 12B).

The present embodiment can provide a transversely gain-guided waveguide structure by increasing the overall width of the insulator mask in grid and setting the optical active layer to not less than 5 $\mu$m. On the other hand, the present embodiment can provide a refractive index-guided structure with a buried heterostructure by decreasing the overall width of the insulator mask and setting the optical active layer in the range of 1 to 3 $\mu$m. This method improves the density of three-dimensional nucleation and can promote the transverse coalescence of crystal layers in the first step, thereby making it possible to form the optical waveguide 5 having a flat and smooth surface. Also, the continued selective growth can form an optical active layer and an upper waveguide layer composed of a crystal layer flat and higher in quality than in the method employing the bulk growth on the upper flat surface of the optical waveguide 5. An optical waveguide structure of low optical loss can thus be produced. This device performs the lasing operation with lower threshold current than the device formed by the conventional method of bulk growth, and the lasing wavelength thereof at room temperature is in the range of 410 to 430 nm.

<Embodiment 8>

A still further embodiment of the invention will be explained with reference to FIGS. 13A and 13B. The device is fabricated in a similar manner to the seventh embodiment, but is different in that a pattern of rectangular window regions (openings) 40 of an insulator mask 4 shown in FIG. 13B are staggered between different columns.

By displacing the pattern of the openings 40 by one half period between adjacent columns as in the insulator mask 4 according to the present invention, coalescence is promoted between the crystal layers homoepitaxially grown onto the upper surface of the insulator from each end of adjacent openings, thereby making it possible to form a uniform and flat semiconductor layer. Further, if the openings are miniaturized, a larger width between the window regions can be secured and increases the area of the homoepitaxially grown flat layer in the desired shape.

According to this embodiment, it is possible to produce an optical waveguide layer 5 having a more flat and smoother upper surface than in the seventh embodiment. Further, a waveguide structure with a buried heterostructure can be formed with an upper waveguide layer and an optical active layer constituting a flat and high-quality crystal layer on the optical waveguide layer 5. As a result, the threshold current can be reduced to at least one half or less of the threshold current for the first embodiment.

A variation of this invention will be explained with reference to FIG. 13C. This example is different in that each window region of the insulator mask 4 is in the shape of equilateral hexagon. Crystal layers in the shape of equilateral hexagon staggered between columns are selectively grown in the window regions in the shape of equilateral hexagon of the insulator mask, and can be easily coalesced with each other into a flat single optical waveguide layer. Consequently, an optical waveguide layer 5 has an upper surface more flat and smoother than that of the device using the insulator mask shown in FIG. 13B. Further, a waveguide structure with a buried heterostructure including an upper waveguide layer and an optical active layer composed of flat, high-quality crystal layers could be formed on the optical waveguide layer 5. As a result, the threshold current could be reduced at least to one fourth of the threshold current in the seventh embodiment.

FIG. 13A shows a section taken in line H–H' in FIG. 13B or 13C.

<Embodiment 9>

Figure 14A:
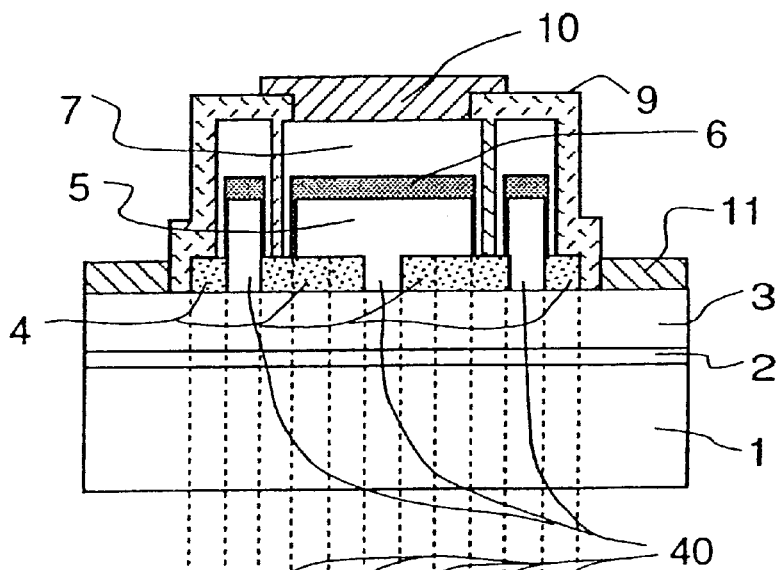
FIG. 14A is a longitudinal sectional view of an example of a semiconductor optical device according to a ninth embodiment of the invention.
Figure 14B:
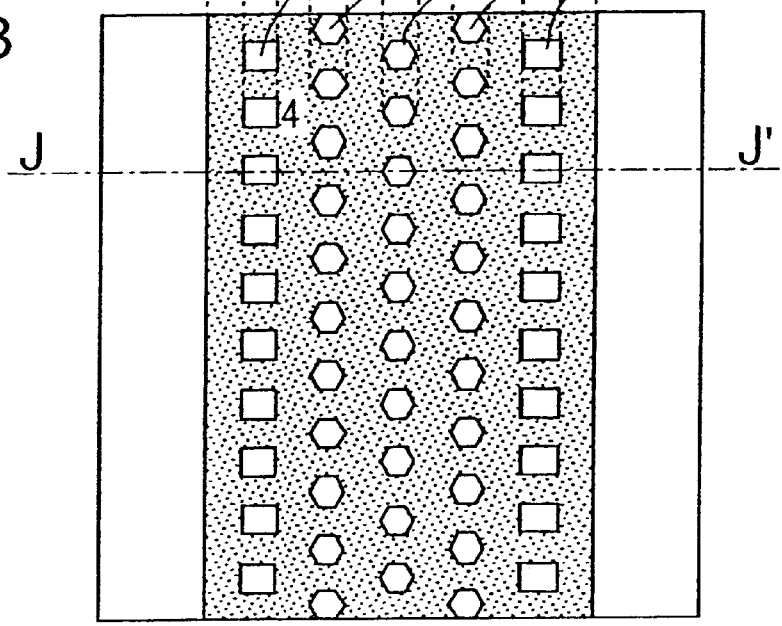
FIG. 14B is a top plan view of an insulator mask formed in a device.

A still further embodiment of the invention will be described with reference to FIGS. 14A and 14B. This device is fabricated in a similar fashion to that of the eighth embodiment. As shown in FIG. 14B, however, the columns of openings at the extreme ends of the insulator mask 4 are formed as a dummy pattern for selective growth. The dummy pattern and the pattern of three central columns of openings are spaced appropriately from each other in order that the crystal layers formed on them may not coalesce with each other. At the same time, the optical waveguide layers 5 on the central pattern of three columns are coalesced into a single optical waveguide layer, on which a layer 6 is formed as a single optical active layer structure. The crystal layers grown on the dummy pattern are covered with an insulator not to be supplied with a current. In the remaining points, exactly the same process is followed as in the third embodiment. A longitudinal section of the device shown in FIG. 14A (the section taken in line J–J' in FIG. 14B) is thus obtained.

The present embodiment can produce an optical waveguide layer 5 having a more flat and smoother upper surface than the device of the eighth embodiment employing the insulator mask shown in FIG. 13C. Further, an upper waveguide layer and an optical active layer made of a flat, high-quality crystal layer can be formed on the optical waveguide layer 5. As a result, the threshold current can be reduced at least to $\frac{2}{3}$ to $\frac{1}{2}$ that for the device of the eighth embodiment employing the insulator mask shown in FIG. 13C.

<Embodiment 10>

Figure 15A:
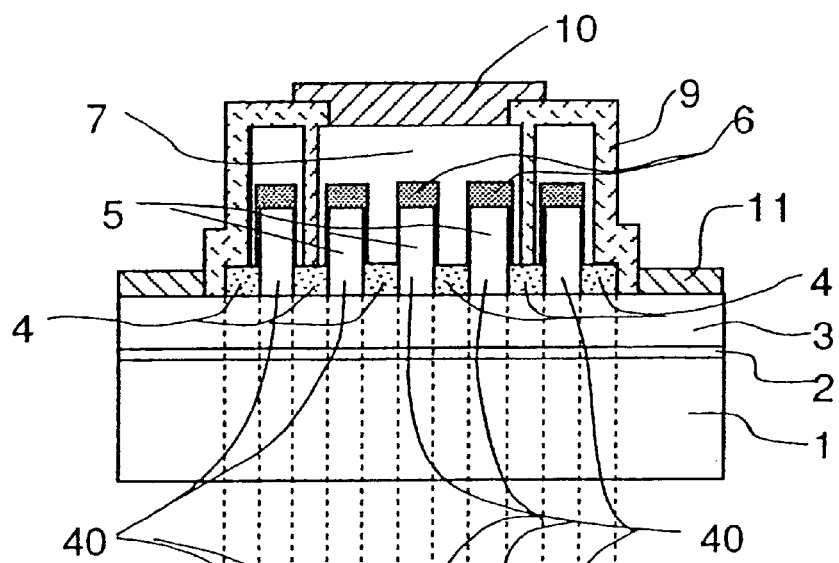
FIG. 15A is a longitudinal sectional view of an example of a semiconductor optical device according to a tenth embodiment of the invention.
Figure 15B:
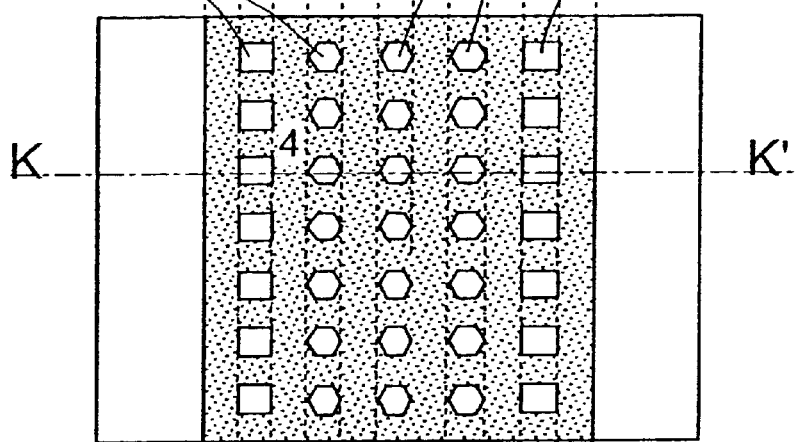
FIG. 15B is a top plan view of an insulator mask formed in the device shown in FIG. 15A.

Another embodiment of the present invention will be explained with reference to FIGS. 15A and 15B. This device is fabricated through a similar process to the ninth embodiment, except that as shown in FIG. 15B, the columns of openings at the extreme ends of the insulator mask 4 are formed as a dummy pattern for selective growth. Also, the interval between the columns of the insulator masks is adjusted in such a manner that the crystal layers formed on the central pattern of three columns as optical waveguide layers 5 are not coalesced with each other, so that the optical active layers are not coalesced with each other transversely between different columns but between the window regions within each column. As a result, stripes of crystal layers connected in each column are formed thereby to produce a waveguide structure in phased array. The crystal layers grown on the dummy pattern of the columns at extreme ends are covered with an insulator not to be supplied with a current. FIG. 15A shows a section taken in line K–K' in FIG. 15B.

According to this embodiment, an operation in fundamental mode satisfying the phase matching conditions is possible for the waveguides in the three central columns. Consequently, an operation is realized with a higher output than in the seventh to ninth embodiments. An output is at least three times higher than the maximum optical output obtained in the ninth embodiment. Also, the pattern width of the insulator mask was reduced, so that a quantum wire could be formed and arranged in array transversely by quantization in the direction perpendicular to the stripes.

A variation of this embodiment will be explained with reference to FIG. 15C. This device is fabricated in a similar manner to the case of FIG. 15A. The only difference lies in that the crystal layers 5 to 7 formed on the central pattern of three columns of openings in the insulator mask 4 are not coalesced with each other. As a result, the crystal layers extending along the length of cavity for lasing (in vertical direction in FIG. 15B) are never connected to each other. In other words, three independent microwaveguides can be formed in parallel. In the case where the width of the microwaveguides is reduced somewhat, the carriers injected into these waveguides are quantized in the direction perpendicular to the length of cavity. Also, the crystal layers grown on the dummy patterns at the extreme ends are covered with an insulator in order not to be supplied with current.

Figure 15C:
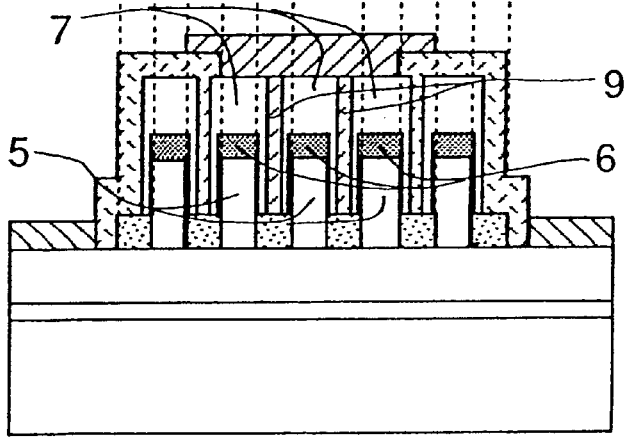
FIG. 15C is a longitudinal sectional view of another example of a device.

In the device shown in FIG. 15C, the waveguide structure of the window regions making up each of the three central columns includes an optical waveguide layer perpendicular to the corresponding substrate surface and forms a multiple cavity mirror. Therefore, the operation in single longitudinal mode with small wire width is possible unlike in the device of FIG. 15A. Also, the device of FIG. 15C constitutes a phased array and operates in fundamental mode satisfying the phase-matching conditions. As a consequence, like the device of FIG. 15A, the device of FIG. 15C can produce an output at least three times as high as the maximum optical output of the ninth embodiment. Also, in the case where the pattern width of the insulator mask 4 is reduced (i.e., the area of each opening 40 is reduced) and the crystal layers 5 to 7 are isolated from each other by the insulators 9 in the direction perpendicular to the length of cavity, then it is possible to produce quantum boxes by quantization in the direction along the cavity length. In this case, an device can be realized with a plurality of quantum boxes arranged two-dimensionally (in grid) on the substrate 1.

<Embodiment 11>

The configuration of the semiconductor device described with reference to the embodiments from the present embodiment to the 14th embodiment is based on the architecture of forming amorphous insulating layers in a plurality of stages on a region (such as a substrate) having a crystal structure. Each insulating layer is formed with at least an opening, and the above-mentioned selective growth of a nitride semiconductor is repeated as many times as the stages of the insulating layers. The openings of the insulating layers are desirably staggered in such a manner that the openings of the insulating layer in the x-th stage as viewed from above, for example, is rendered invisible from the insulating layer in the (x+1)th stage. The object of this architecture is to sharply reduce the crystal defect density in the nitride semiconductor layer formed on the topmost insulating layer by repeating such a selective growth.

The embodiments including the present embodiment to the 14th embodiment refer to a semiconductor laser device, in which insulating layers are formed in two stages on a crystal substrate, and an optical crystal region is formed in the nitride semiconductor layer on the second-stage insulating layer. In spite of this, the number of stages of insulating layers, i.e. the number the selective growth is repeated can be more than two. Specifically, the number of stages of insulating layers is determined according to the trade-off between the quality of the crystal required for the optical crystal region or for the region where carriers to be switched flow on the one hand and the production cost dependent on the number of fabrication steps on the other.

The semiconductor laser devices studied in the present embodiment up to the 14th embodiment each comprise insulator masks in two stages on a substrate, and a layer composed of nitride semiconductor crystal is selectively grown in two steps. In this way, the crystal dislocation density in the optical crystal region (such as an optical waveguide layer) can be considerably reduced. Specifically, assuming that the dislocation density of the crystal layer formed by homoepitaxial growth on the insulator mask in the first stage is in the range of $10^4$ to $10^5$/cm$^2$, for example, the dislocation density of the crystal layer formed by homoepitaxial growth on the insulator mask in the second stage is reduced to the range of $10^3$ to $10^4$/cm$^2$. This crystal dislocation density is substantially at the same level as the dislocation density in the optical crystal region of a semiconductor laser device which already finds applications, i.e. a device fabricated on a substrate made of a III–V semiconductor material (such as GaAs or InP) other than the nitride semiconductor. The reduced defect density in the optical waveguide layer reduces the loss due to the light scattering or the gain loss due to the carrier trap or the light absorption at deep level, and thus contributes to an operation of the semiconductor laser device with low threshold current and high efficiency. Consequently, by forming a high-quality optical waveguide of low defect density by selective growth in two or more stages, for example, it is possible to realize a semiconductor laser device having a refractive index-guided structure controlled in fundamental transverse mode which is adapted to operate with low threshold current, high efficiency and small internal optical loss.

Figure 16A:
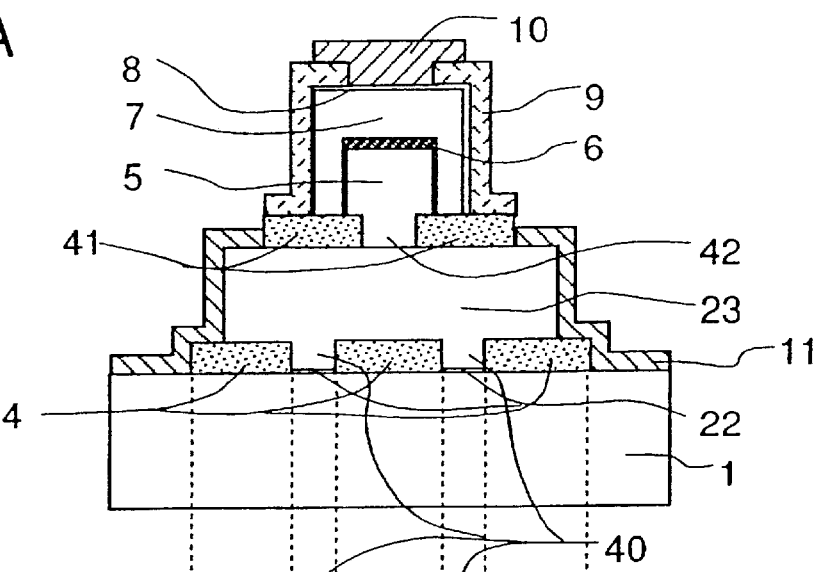
FIG. 16A is a longitudinal sectional view of an example of a semiconductor optical device according to an 11th embodiment of the invention.

Now, a semiconductor laser device according to this embodiment will be described with reference to FIGS. 16A and 16B.

Figure 16B:
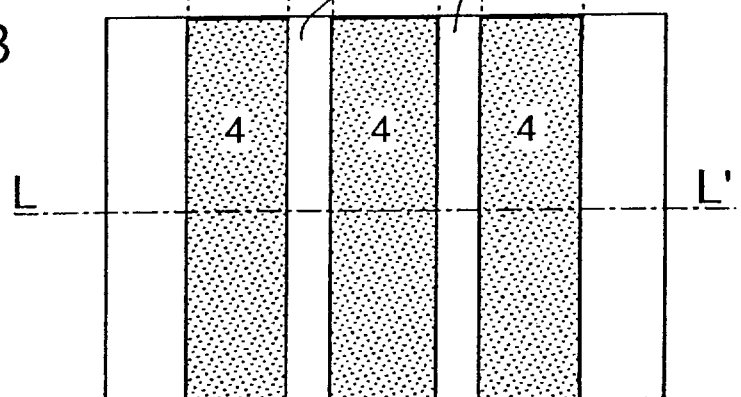
FIG. 16B is a top plan view of an insulator mask formed in the device shown in FIG. 16A.

First, insulator masks 4 having two striped openings 40 shown in FIG. 16B are formed on the (0001)C plane of a sapphire (α-Al$_2$O$_3$) single-crystal substrate 1. The stripes of the insulator masks 4 are formed to extend in parallel to the (11–20)A plane of the sapphire substrate 1. Then, GaN buffer layers 22 and a N-type GaN optical waveguide layer 23 are formed by selective growth in the first step by the metal organic vapor phase epitaxy. In the process, the n-type GaN layer 23 is formed in such a manner that a crystal layer thereof is grown in each of the two striped openings 40 and the two crystal layers thus formed are coalesced with each other by transverse homoepitaxial growth on the central insulator mask thereby to form a single crystal layer.

After that, second-stage insulator masks 41 are formed on the upper surface of the n-type GaN layer 23. A striped opening 42 is formed between the insulator masks 41 over the central insulator mask 4 (i.e., in the masking region sandwiched between the two striped openings 40). The striped opening 42 extends substantially in parallel to the striped openings 40 of the insulator masks 4. Therefore, as viewed from the upper surface of the insulator masks 41, the openings 40 are covered by the insulator masks 41. Selective growth in the second stage is effected using the insulator masks 41 thereby to form a n-type GaN optical waveguide layer 5, a compressive-strained multiple quantum well active layer 6 including an AlGaN separate confinement heterostructure layer, a GaN quantum barrier and a GaInN compressive-strained quantum well, a p-type GaN optical waveguide layer 7 and a p-type GaInN contact layer 8, sequentially in that order. Then, insulators 9 are formed by lithography, and a p-side electrode 10 and n-side electrodes 11 are deposited by evaporation. Finally, the assembly is cleaved in the direction perpendicular to the striped insulator masks to fabricate a cavity mirror. Then, the device is scribed off thereby to produce a longitudinal section shown in FIG. 16A (the section taken in line L–L' in FIG. 16B). Specifically, this semiconductor device has a cavity structure which generates a laser beam in the direction along the striped opening 42 formed between the insulator masks 41.

According to this embodiment, the insulator masks 41 are formed on the semiconductor layer 23 low in crystal defect density produced by selective growth using the insulator masks 4, which insulator masks 41 are used for selective growth to form a waveguide structure for lasing. In this way, the optical loss in the waveguide structure can be reduced below that for the device of the first to tenth embodiments. Specifically, as compared with the crystal defect density in the range of $10^4$ to $10^5/cm^2$ of the nitride semiconductor layer (GaN layer) formed by homoepitaxial growth on the insulator masks 4 on the substrate, the crystal defect density of the nitride semiconductor layers 5 to 8 formed by homoepitaxial growth on the insulator masks 41 based on the GaN layer 23 formed by homoepitaxial growth can be reduced to the range of $10^3$ to $10^4/cm^2$.

Consequently, by forming an optical crystal region by the nitride semiconductor layers 5 to 7, it is possible to considerably reduce the internal optical loss attributable to the light scattering loss due to the crystal defect in the particular region (an optical active layer or an optical waveguide layer) and the gain loss due to the carrier trapping or the light absorption attributable to the deep level in the region. Also, the width of the optical waveguide layer 5 can be regulated by adjusting the width of the window region (the size of the opening 42) between the insulator masks 41. In this way, it is possible to construct either a gain-guided structure by setting the width of the optical active layer 6 on the optical waveguide layer 5 to not less than 5 μm or a refractive index-guided structure with a striped buried heterostructure for guiding the wave with a real refractive-index difference by setting the width of the optical active layer 6 in the range of 1 to 3 μm. With the device having a refractive index-guided structure with a striped buried heterostructure according to this embodiment, an operation is possible with lower threshold current than in the gain-guided structure. The threshold current can thus be reduced to ⅓ to ¼ of the current required for the device of the gain-guided structure. This device performs the lasing operation with lower threshold current and higher efficiency than the conventional device formed by bulk growth, and the lasing wavelength of this device at room temperature is in the range of 410 to 430 nm.

Figure 16C:
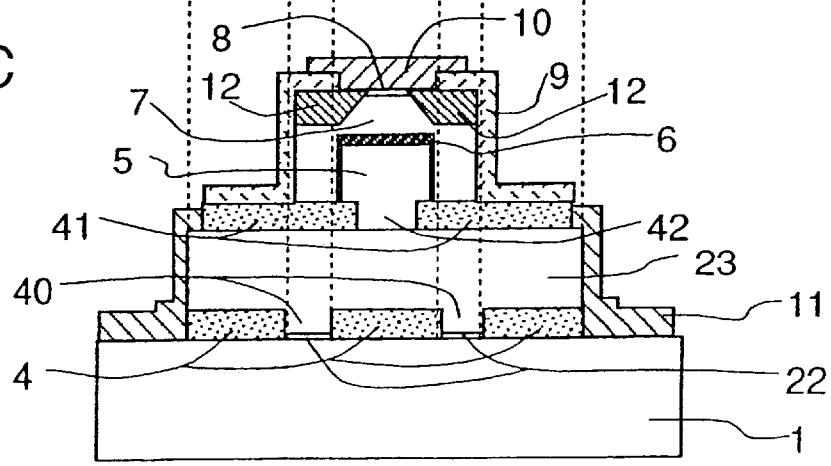
FIG. 16C is a longitudinal sectional view showing another example of a device.

A variation of this embodiment will be explained with reference to FIG. 16C. The device can be fabricated in the same manner as shown in FIG. 16A. After growing up to the layer 8, however, the layers 7 and 8 are etched into the shape of a ridge stripe using an insulator as shown in FIG. 16C. The bottom width of the ridge stripe is set to the range of 2 to 9 μm. Further, a buried layer 12 is formed on each side of the ridge strip using an insulator. The buried layer 12 can be either n-type GaN current-blocking layer formed by selective growth or a layer buried with a dielectric insulator. The specification of the insulator masks 4, 41 is identical to that for the device shown in FIG. 16A, and the buried layers 12 are formed as stripes extending substantially in parallel to the striped opening 42. FIG. 16C shows a section taken in line L–L' in FIG. 16B.

In the device shown in FIG. 16C, current can be injected effectively only by the width of the ridge stripe transversely of the optical active layer 6, thus realizing a refractive index-guided structure with a complex refractive index difference. Also, the flow of the carriers injected into the optical active layer 6 is limited by the gap between the buried layers 12 as well as by the opening 42. Therefore, carriers can be efficiently injected into the desired region of the optical active layer 6 for an improved emission efficiency. This device can perform the lasing operation with substantially the same low threshold current and high efficiency as the striped structure with a buried heterostructure of the device shown in FIG. 16A, and the lasing wavelength of the device at room temperature is in the range of 410 to 430 nm.

<Embodiment 12>

Figure 17A:
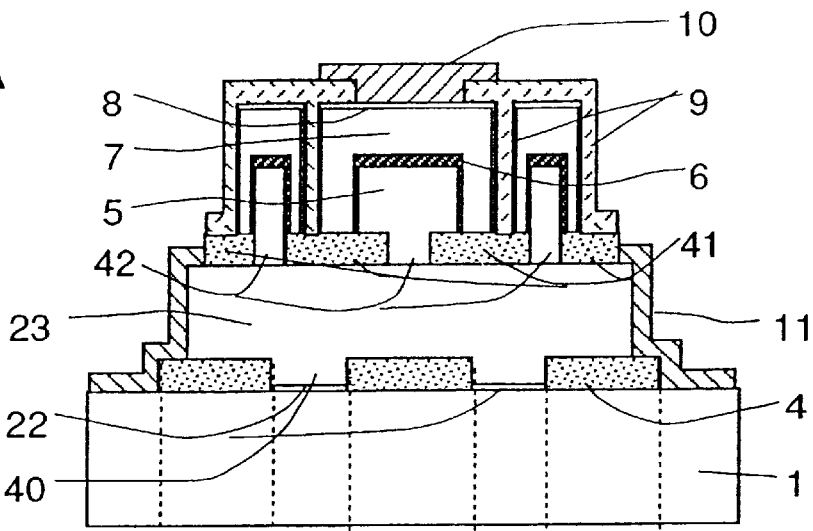
FIG. 17A is a longitudinal sectional view of an example of a semiconductor optical device according to an 12th embodiment of the invention.
Figure 17B:
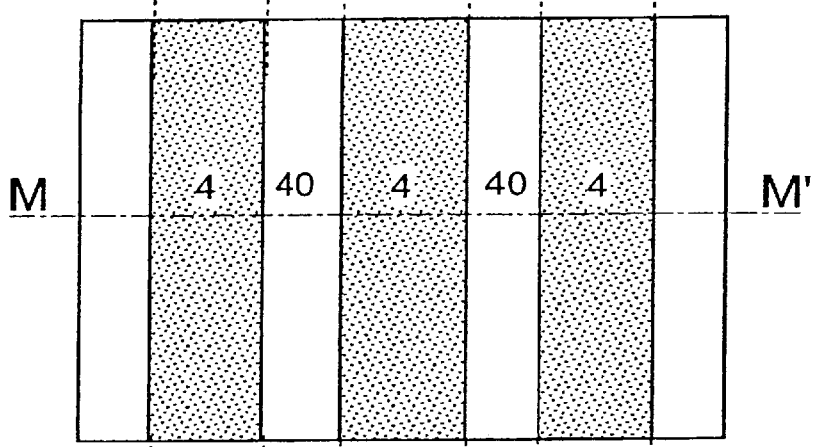
FIG. 17B is a top plan view of an insulator mask formed in the device shown in FIG. 17A.

Still another embodiment of the invention will be described with reference to FIGS. 17A and 17B. The device is fabricated the same way as in the 11th embodiment. The difference, however, lies in that in this embodiment, after forming up to the n-type GaN layer 23, two dummy patterns for selective growth are added outside of the insulator masks 41 shown in FIG. 17A. The interval between three striped openings 42 is set in such a manner that the waveguide structure formed in the central opening (i.e., central window region) of the insulator mask 41 is not coalesced with the crystal layers formed on the dummy patterns. Also, the crystal layers formed on the dummy patterns are covered with an insulator in order not to be supplied with current. The remaining steps are similar to those for the 11th embodiment, and a longitudinal section of the device shown in FIG. 17A (the section taken in line M–M' in FIG. 17B) can thus be produced.

According to this embodiment, the crystallinity and the geometry are improved by avoiding unusual crystal growth in the central the waveguide structure thereby to form a more flat and smoother rectangular striped structure with a buried heterostructure. As a result, the laser beam can be guided with lower loss, and the threshold current can be reduced to at least to the range of ⅔ to ½ of the threshold current of the 11th embodiment. This device performs the lasing operation with the lasing wavelength of 410 to 430 nm at room temperature.

A variation of this embodiment will be explained with reference to FIG. 17C. This device is a compromise between the device of FIG. 16C and that of FIG. 17A. Specifically, according to this embodiment, the p-type GaN optical waveguide layer 7 and the p-type GaInN contact layer 8 are processed into a ridge stripe, on both sides of which buried layers 12 are formed thereby to produce a semiconductor laser device having a longitudinal sectional structure as shown in FIG. 17C.

Figure 17C:
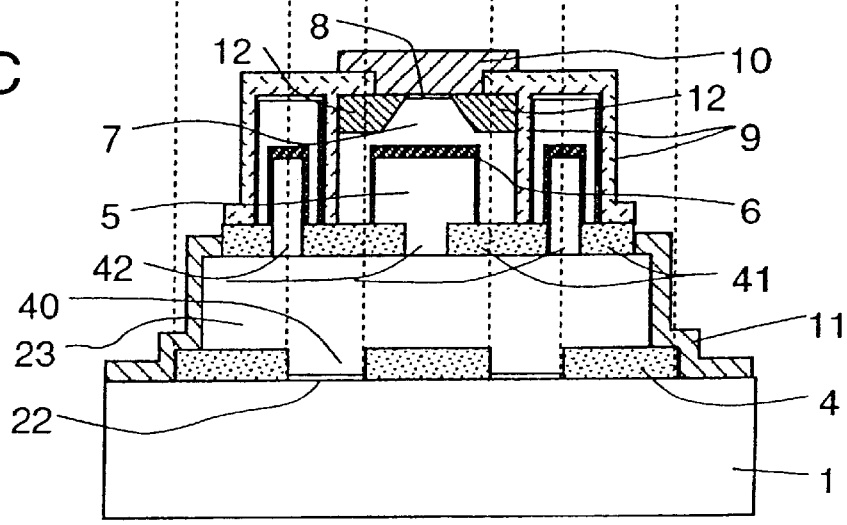
FIG. 17C is a longitudinal sectional view of another example of a device.

In the device shown in FIG. 17C, a waveguide structure can be formed in a ridge stripe structure located at the central portion of the p-type GaN optical waveguide layer 7 having a crystallinity and a geometry improved over those of the 11th embodiment. Further, this permits the laser beam to be guided with a lower loss, and the threshold current can be reduced at least to the range of ⅔ to ½ of the threshold current in the device shown in FIG. 16C. This device performs the lasing operation with the lasing wavelength in the range of 410 to 430 nm.

<Embodiment 13>

A further embodiment of the invention will be described with reference to FIGS. 18A and 18B. The device is fabricated in the same manner as that of the 11th embodiment shown in FIG. 16C, except that as shown in FIG. 18B, insulator masks 4 for selective growth are formed with at least three striped openings formed as window regions 40 before forming the layers 3 and 4. Insulator masks 41 are formed over the layers 4 in such a manner as to cover the openings (window regions) 40 of the insulator masks 4. The openings (window regions) 42 of the insulator masks 41 are formed over the pattern of the insulator masks 4 (i.e., the regions sandwiched by the openings 40). The development of crystal defects can be suppressed in two stages by using the insulators in two steps of selective growth. Then, the crystal layers are coalesced on the insulator masks 41 thereby to form an optical waveguide layer 5. A longitudinal section (the section taken in line N–N' in FIG. 18B) of the device can thus be produced as shown in FIG. 18A in exactly the same way as in the 11th embodiment.

According to this embodiment, the crystal defect density in the optical waveguide layers 5, 7 and the optical active layer 6 can be reduced for a lower internal optical loss as compared with the devices of the 11th and 12th embodiments. In this way, the threshold current can be reduced to about one half that of the device shown in FIGS. 16C and 17C. This device accomplishes the lasing operation with the lasing wavelength in the range of 410 to 430 nm at room temperature.

A variation of this embodiment will be explained with reference to FIG. 18C. This device is a compromise between the device of FIG. 17C and that of FIG. 18A. Specifically, dummy patterns are added to the striped openings 42 of the insulator masks 41.

Figure 18A:
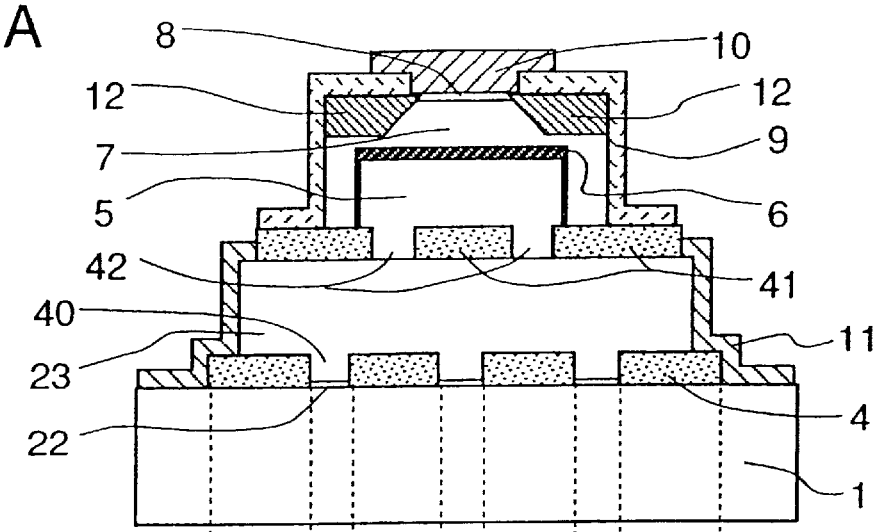
FIG. 18A is a longitudinal sectional view of an example of a semiconductor optical device according to a 14th embodiment of the invention.
Figure 18B:
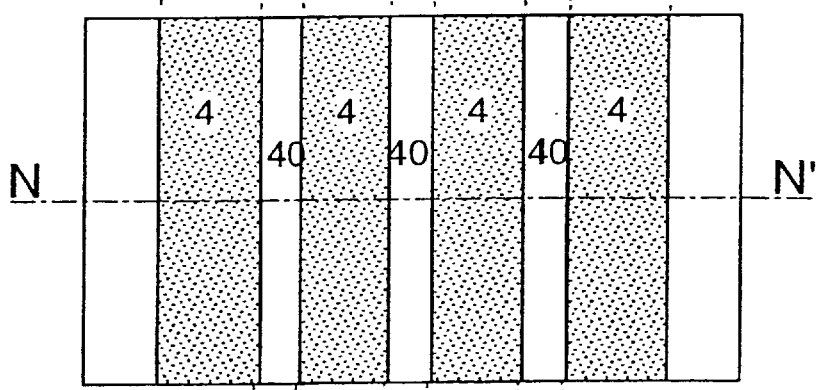
FIG. 18B is a top plan view of an insulator mask formed in a device.
Figure 18C:
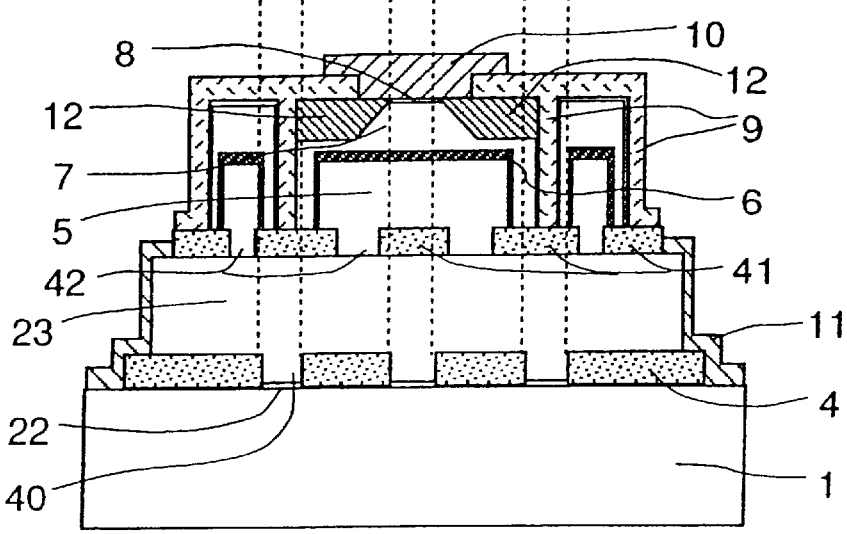
FIG. 18C is a longitudinal sectional view of another example of a device.

With the device shown in FIG. 18C, a waveguide structure having a ridge stripe structure at the central portion of the p-type GaN optical waveguide layer 7 can be formed with a crystallinity and a geometry improved over the device of FIG. 18A. Consequently, the laser beam can be guided with a still lower loss, and the threshold current can be reduced to at least the range of ⅔ to ½ that for the device shown in FIG. 18A. This device performs the lasing operation with the lasing wavelength in the range of 410 to 430 nm at room temperature.

<Embodiment 14>

Still another embodiment of the invention will be described. This device is fabricated in a similar manner to at least one of those described in the 11th to 13th embodiments, except that in this embodiment, the substrate 1 is made of n-type silicon carbide ($\alpha$-SiC) with the substrate surface orientation in the (0001)C plane having a hexagonal symmetry structure instead of a sapphire ($\alpha$-Al$_2$O$_3$) substrate. A n-type GaN buffer layer is formed on this substrate. Then, the device is fabricated through the same steps as any one of the device structures in the 11th to 13th embodiments, thereby producing the device shown in FIGS. 16A to 16C or FIGS. 18A to 18C.

According to this embodiment, the substrate has a conductivity, and therefore can be mounted on a heat sink in such a manner that a n-side electrode is deposited by evaporation on the reverse side of the substrate and the surface of the substrate having a junction formed thereon by crystal growth constitutes the lower surface thereof. Current can thus be supplied from the p-side electrode on the upper surface of the substrate through nitride semiconductors to the n-side electrode on the lower surface of the substrate. Further, the thermal conductivity of the SiC substrate is larger than that of the sapphire substrate, and therefore the SiC substrate has a superior thermal radiation. The heat dissipation can thus be remarkably improved over the other embodiments. The present embodiment can produce a laser device which can operate at a higher temperature than those of other embodiments. This device performs the lasing operation with the lasing wavelength in the range of 410 to 430 nm at room temperature.

<Conclusion>

The description that follows is a summarization of the knowledge obtained on the semiconductor optical devices according to the present invention examined above with reference to the first to 14th embodiments.

In all the embodiments, the device is fabricated by a process comprising a first step of forming a second region made of an insulating material of amorphous structure on a first region having a crystal structure, a second step of forming at least an opening in the second region for exposing the first region constituting a base, and a third step of forming a third region made of the crystal of a nitride semiconductor material on the second region in such a manner as to cover the second region, for example, in that order. This fundamental process of fabricating the device is based on the architecture of the invention that a nucleus for crystal growth is formed only in at least an opening in the second region. Specifically, the nucleation region is limited to the surface of the first region exposed on the bottom of the opening, and the nucleation density is increased at the particular position while at the same time suppressing the nucleation on the second region. For the significance of the latter idea, refer to the discussion made in Conclusion 3 relating to crystal growth.

According to an embodiment, a nitride semiconductor layer is used as a first region formed by epitaxial growth on a sapphire substrate having a crystal structure of the hexagonal system, a silicon carbide substrate or on the (0001) plane of the crystal of any one of the above-mentioned substrates, and a second region is formed on the particular (0001) plane. Further, a nitride semiconductor crystal (GaN layer) is grown as a third region in such a manner as to cover the upper surface of the second region (i.e., the portion other than the opening) two-dimensionally. A nitride semiconductor crystal of a different composition (AlGaInN) is formed by epitaxial growth on the third region thereby to constitute an optical crystal region. A similar device can be produced by forming the first region using a substrate made of GaAs, InP, InAs, GaSb, GaP, GaAsP or GaInAs having a zinc-blende structure, one of cubic systems, and by forming the second region on the particular substrate or on the (111) plane of the nitride semiconductor layer formed by epitaxial growth on the substrate. It should be noted here that the optical crystal region of the conventional semiconductor optical device, which is formed by using a sapphire substrate or silicon carbide having a hexagonal crystal structure and by forming a nitride semiconductor layer on the (0001) plane thereof by heteroepitaxial growth (or by bulk growth), has a crystal defect density in the range of $10^8$ to $10^{11}$/cm$^2$, while the crystal defect density in the optical crystal region of the semiconductor optical device according to the present invention can be reduced to the range of $10^4$ to $10^5$/cm$^2$ or less regardless of which crystal structure, the hexagonal system or the cubic system, is employed for the substrate. Further, in the method according to the 11th to 14th embodiments in which the first region constituted of a nitride semiconductor layer is formed on a region made of an insulating material of amorphous structure, the crystal defect density of the third region formed on the upper surface of the second region (i.e., the portion other than the opening) or on the optical crystal region formed on the third region can be reduced to the range of $10^3$ to $10^4$/cm$^2$ or less.

With the semiconductor optical device according to the present invention, an optical crystal region (an optical waveguide layer, for example) can be formed of a high-quality nitride semiconductor crystal low in defect density as described above, and therefore the optical loss (substantially proportional to the defect density) in the optical crystal region can be reduced. Specifically, in the case where a crystal defect occurs in the optical crystal region, the resulting loss by light scattering, light absorption due to a deep level and the carrier trap lead to a gain loss in the particular optical crystal region. According to the present invention, this gain loss in the optical crystal region is suppressed. The internal optical loss in the optical crystal region can thus be considerably reduced. Therefore, the optical gain in the optical crystal region is improved, thereby making possible a lasing operation with low threshold current.

On the other hand, the third region of the semiconductor optical device according to the invention is grown in rectangle on the second region and has a substantially flat surface of growth. As a result, it is geometrically possible to smoothly realize, using a nitride semiconductor, a gain-guided cavity with a gain distribution in the transverse direction of an active layer (in the direction perpendicular to the cavity length) in a current-blocking layer, or a striped ridge structure or a striped structure with a buried heterostructure constituting a refractive index-guided cavity for guiding the wave in fundamental transverse mode by setting a refractive index difference transversely of the active layer.

The above-mentioned low crystal defect density and smooth rectangular structure of the optical crystal region, which has been realized for the first time by the semiconductor optical device according to the present invention, improves the performance of a semiconductor laser device to such an extent that the threshold current for lasing is reduced to at least one half that of the conventional devices and the internal quantum efficiency at least twice that of the conventional devices. The present inventors have confirmed from various device configurations that the threshold current can be reduced to as low as one-eighth that of the conventional devices. This improved performance is critical to the low-threshold current, high-efficiency operation of a semiconductor laser device.

Further, de pending on the shape of the opening formed in the second region, it is possible to realize a phased array structure capable of high-output operation in fundamental transverse mode or a vertical cavity structure for surface emitting suitable for reducing the threshold current. In the former structure, an operation in longitudinal single mode can be achieved by forming a waveguide structure as a cavity mirror in each window region (opening) of the insulator mask. In the device having the configuration shown in the 11th to 14th embodiments, the threshold current for lasing can be reduced to ⅓ to ¼ that of the conventional devices having a gain-guided structure, by fabricating a striped refractive index-guided structure with a buried heterostructure having a real refractive index difference in the direction transverse of an active layer or a ridge-striped refractive index-guided structure having a complex refractive index difference formed by etching, depending on the design width of the window region of the insulator mask.

In the device according to each of the embodiments, the lasing wavelength at room temperature is set to the wavelength of the blue-violet region in the range of 410 to 430 nm. The emission of green to violet not ore than 600 nm in lasing wavelength is possible by appropriately setting the composition of the nitride semiconductor layer making up the optical crystal region. For this method, refer to the references cited first above as the prior art.

INDUSTRIAL APPLICABILITY

In the semiconductor materials and the methods of fabrication thereof according to the invention, there is provided a body suitable for growing the crystal of a nitride semiconductor or a III–V compound semiconductor having a hexagonal crystal structure while at the same time suppressing the defect density thereof to $10^7/cm^2$ or less. Therefore, the semiconductor device that already finds applications using a III–V compound semiconductor having a crystal structure of the cubic system can be configured and used in practical applications with the crystal of a nitride semiconductor or the crystal of a III–V compound semiconductor having a hexagonal crystal structure.

Further, with the semiconductor optical device constituting one of the semiconductor devices according to the invention, the optical loss or the carrier loss in the optical crystal region can be reduced. For example, the 100-hour continuous operation (CW oscillation) by a semiconductor laser device composed of a nitride semiconductor that has so far been considered difficult is made possible by the invention. A semiconductor laser device according to the invention, therefore, has an additional effect of promoting the practical application of commercial equipments such as a high-definition DVD, a high-density MD or a laser display using what is called a short-wavelength laser beam of blue-green to blue-violet.

What is claimed is:

1. A semiconductor device comprising a first region made of the crystal of a compound semiconductor containing at least nitrogen as a component element and a second region made of an insulator of an amorphous structure, wherein at least a portion of said first region is on said second region.

2. A semiconductor device according to claim 1, wherein the density of defects existing in the crystal of the portion of said first region on said second region is not more than $10^7$ $cm^{-2}$.

3. A semiconductor device according to claim 1, wherein the compound semiconductor constituting said first region is configured of a group-III element and a group-V element.

4. A semiconductor device according to claim 1, wherein said at least a portion of said first region, on said second region, is formed by homo-epitaxial growing.

5. A semiconductor device according to claim 1, wherein said second region has holes therethrough, and material of the first region is provided in said holes.

6. A semiconductor device comprising a first region made of a compound semiconductor having a hexagonal symmetry crystal structure and a second region made of an insulator having an amorphous structure, wherein at least a portion of said first region is on said second region.

7. A semiconductor device according to claim 6, wherein the density of defects existing in the crystal of the portion of said first region on said second region is not more than $10^7$ $cm^{-2}$.

8. A semiconductor device according to claim 6, wherein the compound semiconductor constituting said first region is configured of a group-III element and a group-V element.

9. A semiconductor device according to claim 6, wherein said at least a portion of said first region, on said second region, is formed by homo-epitaxial growing.

10. A semiconductor device according to claim 6, wherein said second region has holes therethrough, and material of the first region is provided in said holes.

11. A method of fabricating a semiconductor device, comprising the step of growing laterally the crystal of a compound semiconductor containing at least nitrogen as a constituent element, grown on the insulator surface of an amorphous structure by laterally epitaxial growth, which is laterally homo-epitaxial growing on sidewalls of crystal of the compound semiconductor containing at least nitrogen.

12. A method of fabricating a semiconductor device according to claim 11, wherein said insulator is formed on a crystal substrate having a hexagonal symmetry structure and has at least an opening.

13. A method of fabricating a semiconductor device, comprising the step of growing laterally the crystal having a hexagonal symmetry structure of a compound semiconductor configured of a group-III element and a group-V element on the insulator surface of an amorphous structure through homo-epitaxial growing.

14. A semiconductor device comprising a first region having a crystal structure, a second region made of an insulating material of an amorphous structure formed on said first region and a third region made of the crystal of a compound semiconductor containing nitrogen and formed on said second region, wherein at least an opening is formed in said second region, and said first region and said third region are coupled to each other in said opening.

15. A semiconductor device according to claim 14, wherein said third region includes an optical crystal region, and said optical crystal region is formed on said first region.

16. A semiconductor device according to claim 15, wherein said optical crystal region has a cavity structure for generating a laser beam.

17. A semiconductor device according to claim 14, wherein said third region is formed by stacking at least two semiconductor layers having different band gaps.

18. A semiconductor device comprising a first region having a crystal structure, a second region made of an insulating material of an amorphous structure formed on said first region, and a third region made of a hexagonal crystal structure of a compound semiconductor configured of a group-III element and a group-V element and formed on said second region, wherein at least an opening is formed in said second region, and said first region and said third region are coupled to each other in said opening.

19. A semiconductor device according to claim 18, wherein said third region includes an optical crystal region, and said optical crystal region is formed on said first region.

20. A semiconductor device according to claim 19, wherein said optical crystal region has a cavity structure for generating a laser beam.

21. A semiconductor device according to claim 18, wherein said third region is formed by stacking at least two semiconductor layers having different band gaps.

22. A semiconductor device comprising:
an insulator of an amorphous structure; and
a crystal region of a compound semiconductor containing at least nitrogen as a component element, grown laterally on the surface of said insulator by lateral homoepitaxial growing.

23. A semiconductor device according to claim 22, wherein the density of defects existing in the crystal of said compound semiconductor is not more than $10^7$ cm$^{-2}$.

* * * * *